United States Patent [19]

Morishita

[11] Patent Number: 6,047,298
[45] Date of Patent: Apr. 4, 2000

[54] TEXT COMPRESSION DICTIONARY GENERATION APPARATUS

[75] Inventor: Taro Morishita, Nara, Japan

[73] Assignee: Sharp Kabushiki Kaisha, Osaka, Japan

[21] Appl. No.: 08/791,392

[22] Filed: Jan. 30, 1997

[30] Foreign Application Priority Data

Jan. 30, 1996 [JP] Japan ................................ 8-013892

[51] Int. Cl.[7] ...................................................... G06F 5/01
[52] U.S. Cl. .......................... 707/532; 707/101; 345/202; 341/106
[58] Field of Search ............................. 707/532, 101, 707/100, 102; 704/10; 364/715.02; 345/202; 341/51, 106; 358/262

[56] References Cited

U.S. PATENT DOCUMENTS

| | | | |
|---|---|---|---|
| 4,558,302 | 12/1985 | Welch | 340/347 |
| 4,560,976 | 12/1985 | Finn | 340/347 |
| 4,597,057 | 6/1986 | Snow | 364/900 |
| 4,747,053 | 5/1988 | Yoshimura et al. | 364/419 |
| 4,791,587 | 12/1988 | Doi | 364/900 |
| 4,899,148 | 2/1990 | Sato et al. | 341/65 |
| 5,049,881 | 9/1991 | Gibson et al. | 341/95 |
| 5,281,967 | 1/1994 | Jung | 341/55 |
| 5,396,595 | 3/1995 | Standley | 395/250 |
| 5,442,350 | 8/1995 | Iyer et al. | 341/51 |
| 5,467,087 | 11/1995 | Chu | 341/51 |
| 5,530,645 | 6/1996 | Chu | 364/419.13 |
| 5,548,338 | 8/1996 | Ellis et al. | 348/473 |
| 5,650,783 | 7/1997 | Murashita et al. | 341/107 |
| 5,815,096 | 9/1998 | Smith | 341/51 |

FOREIGN PATENT DOCUMENTS

| | | |
|---|---|---|
| 2-271723 | 11/1990 | Japan . |
| 3-206533 | 9/1991 | Japan . |
| 5-46357 | 2/1993 | Japan . |

OTHER PUBLICATIONS

David D.Riley, Data Abstraction and Structures Using C++, p. 244, 1994.

*Primary Examiner*—Joseph H. Feild
*Assistant Examiner*—Cong-Lac Huynh

[57] ABSTRACT

A text compression dictionary generation apparatus including: a frequency guideline calculation unit for calculating, with respect to a target compression rate, a frequency guideline for each character string having a length of at least two characters, required to occur in the text to cutout the target compression rate; a long character string cutout unit for cutting out a character string from the text having a length of at least two character which occurs at a frequency matching the corresponding frequency guideline of a character string, together with the actual frequency in the descending order of the length of the character string to generate a first static dictionary, while simultaneously generating a group of the remaining text not cut out and not matching the frequency guideline; a one-character symbol extraction unit for counting the frequency of each character of one-character string length from the group of remaining text not cutout to generate a second static dictionary; and an eventual static dictionary build up unit for generating an eventual static dictionary by adding the second static dictionary to the first static dictionary.

27 Claims, 45 Drawing Sheets

CHARACTER STRING LENGTH::Li(byte)(i=2,3,4,...,N)
NUMBER OF SYMBOLS (INPUT)::SN
FREQUENCY TOTAL FACTOR::$\alpha$ (>1)
TARGET COMPRESSION RATE (INPUT)::RT(0<RT<1)
CODE FACTOR 1::$\beta$
CODE FACTOR 2::$\gamma$
FREQUENCY GUIDELINE::Gi SN=10,000
RT=2/5
$\alpha$=30 (EMPIRICAL VALUE)
$\beta$=3
$\gamma$=1/2

| |
|---|
| SOURCE TEXT::ST   LENGTH OF LONGEST CHARACTER STRING CUT OUT::n   SPECIFIED FREQUENCY OF i-CHARACTER STRING::Gi |
| GROUP OF REMAINING TEXT NOT CUT OUT AFTER REMOVAL OF i-CHARACTER STRING::STi= {T(i,1),...,T(i,Mi)} |
| FREQUENCY TABLE OF i-CHARACTER STRING::FRQi= {(string,frequency)} |
| GROUP OF (CHARACTER STRING, OCCURRENCE COUNT) AFTER i-CHARACTER STRING COUNT PROCESS::OCi= {(string,occurrence)} |
| POSITION FROM BEGINNING OF TEXT TO BE PROCESSED::pos |
| CHARACTER STRING OF LENGTH i WITH pos POSITION AS BEGINNING::str(pos,i) |
| EVENTUALLY GENERATED FREQUENCY TABLE::FRQ |

SPECIFIED FREQUENCY= {
G8=4,G7=4
G6=12,G5=16
G4=16,G3=32
G2=64    }

```
FRQ8=
      {("辞書の本体データ"、10)、
       ("のインデックスを"、8)、
        ・・・
       ("手段の一例を表す"、8)、
        ・・・     }
```
303H

```
FRQ2=
       { ("入力"、288)、
                ・・・         }
```

FIG.5C

```
FRQ= { ("辞書の本体データ"、10)、
       ("のインデックスを"、8)、
       ("手段の一例を表す"、8)、
       ("記憶するための"、12)、
       ("データの追加"、37)、
       ("インデックス"、388)、
       ("入力文字列"、68)、
       ("するための"、18)、    ("比較を行な"、16)、
       ("記憶する"、114)、    ("手段と、"、16)、
       ("文字列を"、85)、    ("検索用"、33)、
       ("ための"、75)、    ("第2の"、32)、    ("なる"、68)、
                ・・・                    }
```
       303K

GROUP OF TEXT TO BE PROCESSED::T

GROUP OF (CHARACTER STRING,OCCURRENCE COUNT) AFTER i-CHARACTER STRING COUNT PROCESS::OCi

FIG. 7A

SOURCE TEXT::ST
LENGTH OF LONGEST CHARACTER STRING CUT OUT::n
SPECIFIED FREQUENCY OF i-CHARACTER STRING::Gi
EFFICIENCY INDICATING FUNCTION:: x;CHARACTER STRING LENGTH
y;OCCURRENCE COUNT
GROUP OF REMAINING TEXT NOT CUT OUT::STr
EVENTUALLY GENERATED FREQUENCY TABLE::FRQ
GROUP OF (CHARACTER STRING,OCCURRENCE COUNT) AFTER i-CHARACTER STRING COUNT PROCESS::OCi= {(string,occurrence)}

FIG. 7B

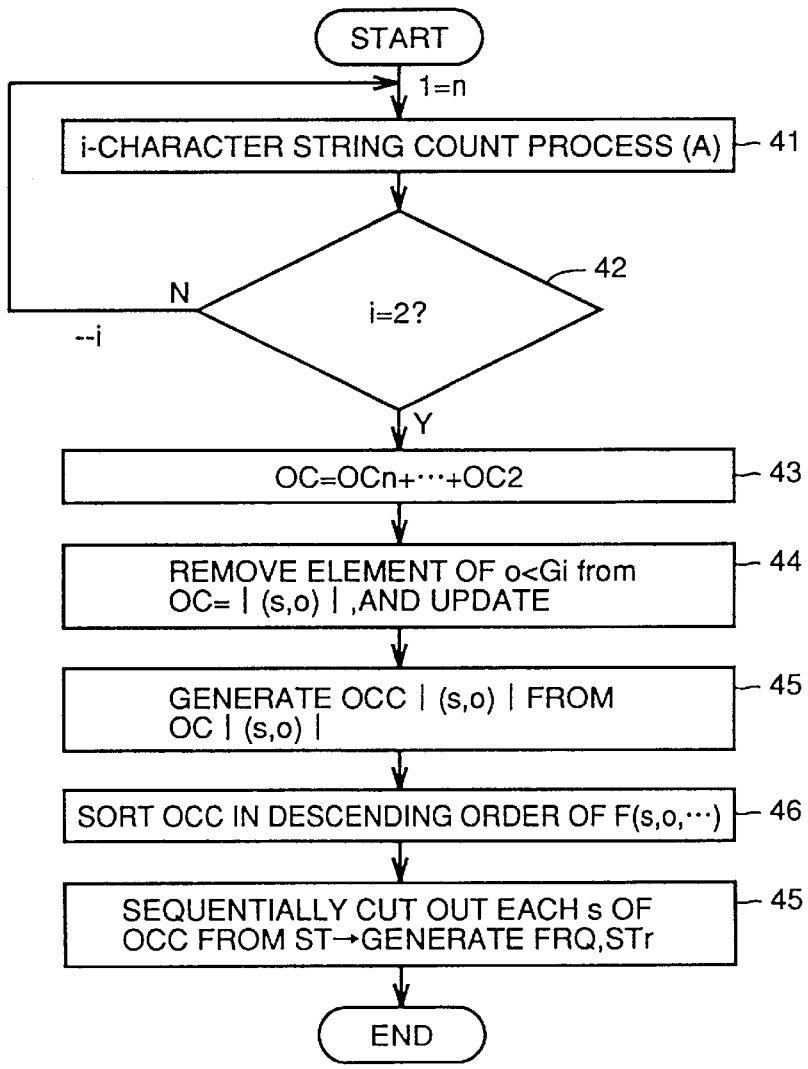

```
OCC=  ("インデックス"、2394)、
      ("データ"、1080)、
      ("記憶する"、564)、
      ("文字列"、561)、
      ("する"、480)、
      ("ための"、375)、
      ("手段"、364)、
      ("入力"、352)、
         ・・・
      ("入力文字列"、340)、
         ・・・
      ("のインデックスを"、64)、
         ・・・         }
```
49

FIG.8C

```
n=8    SPECIFIED FREQUENCY= {
                    G8=4,G7=4
                    G6=12,G5=16
                    G4=16,G3=32
                    G2=64    }
```

FIG.8D

| EFFICIENCY INDICATING FUNCTION F(X,Y)=XY |
|---|

FRQ= { ("インデックス"、399)、("データ"、322)、
       ("記憶する"、141)、("文字列"、144)、
       ("する"、196)、("ための"、125)、("手段"、120)、
       ("入力"、176)、("表す"、122)、("検索用"、30)、
       ("辞書"、214)、("本体"、97)、("記憶"、220)、
       ("第2の"、32)、("の一例"、30)、("と、"、74)、
       ("なる"、86)、("追加"、64)、
       ・・・    ("で比較を行なう"、14)、
       ・・・    ("比較を行なった"、15)、
       .  .  .  .                        }

ELEMENT TO BE DELETED::(si,fi)    LENGTH OF SYMBOL TO BE DELETED::p
CUT OUT FREQUENCY TABLE::FRQ
ORIGINAL STATIC DICTIONARY::SD= {(s1,f1),...,(si-1,fi-1),(si,fi),(si+1,fi+1),...,(sn,fn),}
GROUP OF ELEMENTS OF SD HAVING A CHARACTER STRING LENGTH
OF NOT MORE THAN (p-1)::LowP= {(sj,fj)} ,|sj|<p
STATIC DICTIONARY AFTER SYMBOL DELETION::SDreduce

FIG.10A

SD= {…、("の"、2468)、("を"、1234)、…
("インデックス"、388)、
("手段"、206)、
・・・
("辞書の本体データ"、10)、
("圧縮対象データ"、9)、
("のインデックスを"、8)、 ← ELEMENT TO BE DELETED
・・・
("の"、2468)、
("を"、1234)、
・・・     }

TEXT TO BE CUT OUT= "のインデックスを"

FIG.10D

LowP= {…、("圧縮対象データ"、9)、…
・・・
("インデックス"、388)、
("手段"、206)、
・・・
("の"、2468)、
("を"、1234)、
・・・     }

FIG.10E

FRQ1= {("インデックス"、1)、
("の"、1)、
("を"、1)}

FIG.10F

SDreduce1= {…、("辞書の本体データ"、10)、…
・・・
("インデックス"、396)、
("手段"、206)、
・・・
("の"、2476)、
("を"、1242)、
・・・     }

| ELEMENT TO BE DELETED::(s,f)   LENGTH OF SYMBOL TO BE DELETED::N |
| DECOMPOSITION POSITION OF i-th OCCURRENCE::p(i) |
| NUMBER OF DECOMPOSITIONS::d |
| DECOMPOSITION CANDIDATE GROUP::C |
| ORIGINAL STATIC DICTIONARY::SD= {...,(s,f),...} |
| STATIC DICTIONARY AFTER SYMBOL DELETION::SDreduce |

SD= {  . . .
("辞書の本体データ"、10)、 ← ELEMENT TO BE DELETED ─79
. . .
("辞書の本体"、16)、
("データ"、148)、
. . .
("辞書の"、8)、
("本体データ"、8)、
. . .         }

辞書の本体データ ─7A
1 2 3 4 5 6 7

C=1 {((  "辞書の"、8)、("本体データ"、8))、 ← ELEMENT TO BE SELECTED
((  "辞書の本体"、16)、("データ"、148))、}  ─7B

EFFICIENCY EXPONENT 1=18/8+18/8=4.5
EFFICIENCY EXPONENT 2=26/16+158/148=2.6  ─7C

SDreduce= {  . . .
("辞書の本体"、16)、
("データ"、148)、
. . .
("辞書の"、18)、
("本体データ"、18)、
. . .         }  ─7D

FIG.16A

〔peis〕〔名〕（1）歩調（2）あゆみ（3）歩幅〔動〕〔自他〕（1）足なみをそろえる（2）ゆっくりあるく at a slow pace.＼ゆっくりした歩調で、〔名〕〔複数〕-s〔動〕〔三単〕-s〔去分〕-d〔G〕
pacing
〔〈米〉pe'isme'ikOr,〈英〉pe'isme'ikO〕〔名〕（1）ペースメーカー
・・・

〔peis〕〔名〕（1）歩調（2）あゆみ（3）歩幅〔動〕〔自他〕（1）足な
〈-発音-〉 〈——————————————— 日本語 ———————

みをそろえる（2）ゆっくりあるく●at a slow pace.＼ゆっくりし
————————————— 〉 〈—英語文章—〉 〈—日本語
　　　　　　　　　　　　例文　　　　例文内
　　　　　　　　　　　　区分　　　　区切

た歩調で、　〔名〕〔複数〕-s〔動〕〔三単〕-s〔去分〕-d〔G〕
————— 〉 〈——————————— 変化形 ———————
　　　　　　変化形
　　　　　　区切 pacing
————— 〉
〔〈米〉pe'isme'ikOr,〈英〉pe'isme'ikO〕〔名〕（1）ペースメーカー
〈——————— 発音記号 ———————〉 〈——— 日本語 ———
　　　　　　　　　　　　　　　　　　　　　発音
　　　　　　　　　　　　　　　　　　　　　区切
・・・

[PRONUNCIATION TEXT]

〔peis〕
〔〈米〉pe' isme' ikOr, 〈英〉pe' isme' ikO〕
・ ・ ・

227

[JAPANESE TEXT]

〔名〕（1）歩調（2）あゆみ（3）歩幅〔動〕〔自他〕（1）足なみをそろえる（2）ゆっくりあるく●
ゆっくりした歩調で、
〔名〕（1）ペースメーカー（レース中他の走者のスピード
・ ・ ・

[ENGLISH TEXT]

at a slow pace,\
the Pacific,\
・ ・ ・

[INFLECTED FORM TEXT]

〔名〕〔複数〕-s〔動〕〔三単〕-s〔去分〕-d〔G〕pacing
〔名〕〔複数〕-s
・ ・ ・

FIG.18

| [STATIC DICTIONARY FOR PRONUNCIATION TEXT COMPRESSION] | |
|---|---:|
| 〔 | 30000 |
| pe | 196 |
| is | 1014 |
| 〕 | 30000 |
| 〈米〉 | 5433 |
| . . | . |

| [STATIC DICTIONARY FOR JAPANESE TEXT COMPRESSION] | |
|---|---:|
| 〔名〕 | 28500 |
| (1) | 67964 |
| ゆっくり | 7 |
| ● | 20000 |
| | 24114 |
| . . | . |

| [STATIC DICTIONARY FOR ENGLISH TEXT COMPRESSION] | |
|---|---:|
| at | 810 |
| a | 2961 |
| slow | 24 |
| \ | 28821 |
| | 11922 |
| . . | . |

| [STATIC DICTIONARY FOR INFLECTED FORM] | |
|---|---:|
| 〔名〕〔複数〕-s | 16743 |
| 〔去分〕 | 4964 |
| 〔動〕 | 8658 |
| 〔三単〕-s | 6400 |
| ing | 3114 |
| . . | . |

| [PRONUNCIATION TEXT CODE TABLE] | |
|---|---|
| 〔 | 1110 |
| pe | 00000011011 |
| is | 01110101 |
| 〕 | 1101 |
| 〈米〉 | 101001 |
| . . | . |

| [JAPANESE TEXT CODE TABLE] | |
|---|---|
| 〔名〕 | 100011 |
| (1) | 10101 |
| ゆっくり | 00101101101110 |
| ● | 1101011 |
| | 1110001 |
| . . | . |

| [ENGLISH TEXT CODE TABLE] | |
|---|---|
| at | 001100110 |
| a | 0101011 |
| slow | 00010110111110 |
| \ | 1011 |
| | 11100 |
| . . | . |

| [INFLECTED FORM CODE TABLE] | |
|---|---|
| 〔名〕〔複数〕-s | 111 |
| 〔去分〕 | 10001 |
| 〔動〕 | 0111 |
| 〔三単〕-s | 1101 |
| ing | 10011 |
| . . | . |

| CONTEXT | SYMBOL | NEXT SELECTED CODE TABLE |
|---|---|---|
| PRONUNCIATION TEXT: | "]" | JAPANESE TEXT CODE TABLE |
| JAPANESE TEXT : | "●" | ENGLISH TEXT CODE TABLE |
| | "^" | INFLECTED FORM CODE TABLE |
| ENGLISH TEXT : | "\" | JAPANESE TEXT CODE TABLE |
| | "^" | INFLECTED FORM CODE TABLE |

| SYMBOL | FREQUENCY | OCCURRENCE PROBABILITY | CODE LENGTH |
|---|---|---|---|
| ... | ... | ... | ... |
| 〔三単〕-s^ | 6400 | 6400/1024000 | $-\log_2(6400/1024000)=7.3$bit |
| ... | ... | ... | ... |

| SYMBOL | FREQUENCY | OCCURRENCE PROBABILITY | CODE LENGTH |
|---|---|---|---|
| ... | ... | ... | ... |
| 〔三単〕-s^ | 6400 | 6400/128000 | $-\log_2(6400/128000)=4.3$bit |
| ... | ... | ... | ... |

〔peis〕〔名〕（1）歩調（2）あゆみ（3）歩幅〔動〕〔自他〕（1）足なみをそろえる（2）ゆっくりあるくat a slow pace.＼ゆっくりした歩調で、〔名〕〔複数〕-s〔動〕〔三単〕-s〔去分〕-d〔G〕pacing
・・・
— 444

FIG.24B

〔ゆっくりと〕slowly／〔間もなく・やがて〕soon;by and by;
・・・
— 445

FIG.24C at leisure／ひまで、ゆっくりと
・・・
— 446

```
[peis] [名] (1) 歩調 (2) あゆみ (3) 歩幅 [動] [自他] (1) 足なみを
〈-発音-〉 〈―――――――――――――― 日本語 ――――――――
  記号

そろえる (2) ゆっくりあるく●at a slow pace.＼ゆっくりした歩調
――――――――――――〉〈― 英語文章―〉〈―― 日本語 ――
             例文      例文内
             区分      区切

で、˜[名] [複数] -s [動] [三単] -s [去分] -d [G] pacing
―〉〈―――――――――――― 変化形 ―――――――――〉
 変化形
 区切
 . . .
```
448

FIG.25B

```
[ゆっくりと] slowly／[間もなく・やがて] soon;by and by;
〈―日本語―〉〈-英-〉〈―― 日本語 ――〉〈― 英語 ―〉
   和英    和英           和英
   区切1   区切2          区切1
   . . .
```
449

FIG.25C

```
at leisure／ひまで、ゆっくりと
〈-英語-〉〈―― 日本語 ――〉
  英熟
  区切
  . . .
```
44A

[PRONUNCIATION TEXT]

〔peis〕
. . .

[JAPANESE TEXT]

〔名〕（1）歩調（2）あゆみ（3）歩幅〔動〕〔自他〕（1）足なみを
みをそろえる（2）ゆっくりあるく●
ゆっくりした歩調で、
〔ゆっくりと〕
〔間もなく・やがて〕
ひまで、ゆっくりと
ゆっくり進むこと。
. . .

[ENGLISH TEXT]

at a slow pace,\
slowly/
soon;by and by;
at leisure/
. . .

[INFLECTED FORM TEXT]

〔名〕〔複数〕-s〔動〕〔三単〕-s〔去分〕-d〔G〕pacing
. . .

| [STATIC DICTIONARY FOR PRONUNCIATION TEXT COMPRESSION] | | [STATIC DICTIONARY FOR JAPANESE TEXT COMPRESSION] | |
|---|---|---|---|
| 〔 | 30000 | 〔名〕 | 28500 |
| pe | 196 | 〕 | 57703 |
| is | 1014 | ゆっくり | 26 |
| 〕 | 30000 | ● | 20000 |
| 〈米〉 | 5433 | | 24114 |
| . . . | | . . . | |

| [STATIC DICTIONARY FOR ENGLISH TEXT COMPRESSION] | | [STATIC DICTIONARY FOR INFLECTED FORM] | |
|---|---|---|---|
| at | 1202 | 〔名〕〔複数〕-s | 16743 |
| a | 3970 | 〔去分〕 | 4964 |
| slow | 36 | 〔動〕 | 8658 |
| / | 465421 | 〔三単〕-s | 6400 |
| \ | 11922 | ing | 3114 |
| . . . | | . . . | |

| CONTEXT | SWITCH SYMBOL | NEXT SELECTED CODE TABLE |
|---|---|---|
| (ENGLISH-JAPANESE DICTIONARY) | | |
| PRONUNCIATION TEXT | : "]" | :JAPANESE TEXT CODE TABLE |
| JAPANESE TEXT | : ● | :ENGLISH TEXT CODE TABLE |
| | : "^" | :INFLECTED FORM CODE TABLE |
| ENGLISH TEXT | : "\" | :JAPANESE TEXT CODE TABLE |
| | : "^" | :INFLECTED FORM CODE TABLE |
| (JAPANESE-ENGLISH DICTIONARY) | | |
| JAPANESE TEXT | : "]" | :ENGLISH TEXT CODE TABLE |
| ENGLISH TEXT | : "/" | :JAPANESE TEXT CODE TABLE |
| (ENGLISH IDIOM DICTIONARY) | | |
| ENGLISH TEXT | : "/" | :JAPANESE TEXT CODE TABLE |

```
柑   11000000001000100   17bits
橘   11000000001000111   17bits
(              100101    6bits
か        0001001010111   13bits
ん       11101000010111   14bits
き               001111    6bits
つ
)          000001110110   12bits
類    00101011001101    14bits
ロ         10001001111   11bits
ン         00011001111   11bits
シ             0011011    7bits
ト
の
 . . .
```
— 666

```
柑   011001110001000100   18bits
橘   011001010111000111   18bits
(              100101    6bits
か        0001001010111   13bits
ん       11101000010111   14bits
き               001111    6bits
つ
)          000001110110   12bits
類    100101110011011    15bits
ロ         10001001111   11bits
ン         00011001111   11bits
シ             0011011    7bits
ト
の
*
 . . .
```
— 668

FIG.36

```
APPROACH OF USING ONLY STATIC DICTIONARY
CODE LENGTH OF "柑橘(かんきつ)類" =85bits×3=255bits
CODE LENGTH OF "シトロン" =36bits×3=108bits EMPLOYING OFFSET SUBSTITUTION METHOD
CODE LENGTH OF "柑橘(かんきつ)類"
   →
   INTRODUCTION SYMBOL "*"              7bits×2
   POSITION                             10bits×2
   LENGTH                               5bits×2
   CODE LENGTH OF FIRST OCCURRENCE
   OF "柑橘(かんきつ)類"                  87bits×1
      (TOTAL)                           131bits EMPLOYING OFFSET SUBSTITUTION METHOD
CODE LENGTH OF "シトロン"
   →
   INTRODUCTION SYMBOL "*"              7bits×2
   POSITION                             10bits×2
   LENGTH                               5bits×2
   CODE LENGTH OF FIRST OCCURRENCE
   OF "シトロン"                         37bits×1
      (TOTAL)                           81bits
```
— 669

```
柑    11000000001000100    17bits
橘    11000000001000111    17bits
(                100101     6bits
か       0001001010111     13bits
ん       1110100010111     14bits
き              001111      6bits
つ        000001110110     12bits
)      00101011001101     14bits
類         10001001111     11bits
ロ         00011001111     11bits
ン            0011011      7bits
シ
ト
の
・
・
・
```
└─ 777

```
柑    011001110001000100    18bits
橘    011001010111000111    18bits
(                 100101     6bits
か        0001001010111     13bits
ん        1110100010111     14bits
き               001111      6bits
つ         000001110110     12bits
)       100101110011011     15bits
類          10001001111     11bits
ロ          00011001111     11bits
ン             0011011      7bits
シ
ト
の
△
★
・・・
```
└─ 779

FIG.43

```
APPROACH OF USING ONLY STATIC DICTIONARY
CODE LENGTH OF "柑橘（かんきつ）類" =85bits×3=255bits
CODE LENGTH OF "シトロン" =36bits×3=108bits EMPLOYING NUMBER SUBSTITUTION METHOD
CODE LENGTH OF "柑橘（かんきつ）類"
  →
  NUMBER REGISTRATION INTRODUCTION SYMBOL "△"    8bits×1
  NUMBER REFERENCE INTRODUCTION SYMBOL "★"       7bits×2
  NUMBER                                          3bits×3
  LENGTH                                          5bits×1
  CODE LENGTH OF FIRST OCCURRENCE
  OF "柑橘（かんきつ）類"                          87bits×1
    (TOTAL)                                       123bits EMPLOYING NUMBER SUBSTITUTION METHOD
CODE LENGTH OF "シトロン"
  →
  NUMBER REGISTRATION INTRODUCTION SYMBOL "△"    8bits×1
  NUMBER REFERENCE INTRODUCTION SYMBOL "★"       7bits×2
  NUMBER                                          3bits×3
  LENGTH                                          5bits×1
  CODE LENGTH OF FIRST OCCURRENCE
  OF "シトロン"                                   37bits×1
    (TOTAL)                                       73bits
```
— 77A

TEXT COMPRESSION DICTIONARY GENERATION APPARATUS

FIELD OF THE INVENTION

The present invention relates to text compression dictionary generation apparatus and text compression apparatus handling fixed text data associated with information equipment such as a word processor (referred to as WP hereinafter) and a book-type electronic organizer.

BACKGROUND OF THE INVENTION

Information equipment such as a WP, a personal computer (referred to as PC hereinafter), and a book-type electronic organizer in which an electronic dictionary function is incorporated must have a great amount of fixed text data stored internally and which must correspond to the description of contents of a dictionary.

Text data handled in such type of products often require great storage capacity on the order of several megabytes. The great amount of data stored in a ROM (Read Only Memory), a hard disc, and the like will become a bottleneck in increasing the cost performance unless the number of ROMs is reduced, or unless a device is provided to reliably obtain an empty region in the hard disc by means of text compression.

The conventional method of text compression is mainly classified as set forth in the following.

(1) Assigning a code of a frequently-appearing code string to a code empty region (Japanese Patent Laying-Open No. 2-271723)

(2) Substitute a character string in the source text with a dictionary number in a word dictionary that is additionally provided (Japanese Patent Laying-Open No. 5-46357)

(3) Substitute a frequently-appearing character string code with another code (Japanese Patent Laying-Open No. 3-206533)

(4) Apply a general-purpose compression method (Huffman method, arithmetic compression system, etc.)

All these methods have both their advantages and disadvantages. None of these methods can be selected as the definite method for compressing fixed data of a great storage capacity at high efficiency under the current limited memory capacity and CPU power.

The above method of (1) is appropriate only in the case where the text to be compressed is described just by particular codes. Since the empty region of the code per se is limited in space, the number of character strings that can be substituted with a short code is limited, and the compression rate is not good. This method is inappropriate in the case where there are a plurality of codes or where special codes such as external characters are mixed.

The compression method of (2) is implemented by substituting a character string in the source text that matches a heading word in the dictionary for a kana-kanji conversion with a heading number in the dictionary when there is an additional application such as a kana-kanji conversion module.

This method is not applicable to a character string that is not present in the dictionary heading. Even if the character string matches a heading in the dictionary, compression can not be effected if the length of the character string is smaller than the number of bits representing a dictionary number (approximately 16 bits in general). Although a code table is not necessary, the compression rate is not favorable.

The method of (3) depends on the fixed text. It is suitable for compressing text including a long character string with variation in the frequency of occurrence.

The compression rate is not satisfactory in just substituting a word of high frequency with another code since the number of character strings that can be substituted is limited as in the case of the method of (1) where a plurality of codes are mixed.

Furthermore, a substitution table (coding table) of the frequently-appearing word and substituted code is necessary. The substitution table will be increased in size to degrade the compression rate if some measure to adjust the size of the substitution table is not taken. Although there is an approach of using a statistic method on a static dictionary cut out by an appropriate method, no conventional art explicitly discloses specific means of building a static dictionary from fixed text.

The method of (4) can achieve a high compression rate if there is no restriction in the CPU performance and RAM capacity. A statistical model of a high order, for example, is known.

However, such a function cannot be incorporated in information equipment of a small size from the stand point of cost. Furthermore, the processing speed of this method is slow. Therefore, the method of (4) is not applicable for practical usage.

The general-purpose method based on statistic information (the simple Huffman method, arithmetic-compression method, and the like) cannot achieve a high compression rate since the code to be compressed is only 1 byte (1 character). In contrast, the interest of compression has a variable length. The compression method based on a dynamic dictionary has a poor compression rate and a great storage capacity of the RAM is required in the case where there are few character string patterns that occur repeatedly although the length is variable or in the case where the data to be compressed are located in various working areas.

Recently, some general-purpose methods have been proposed in which the method based on a dictionary and the statistical method are united. However, these methods cannot not have the frequency information calculated in advance since this method is based on an universal compression that "allows processing of any entered data". The united method has a lower compression rate as to fixed data of a large capacity in comparison to the method of the present invention where frequency information is pre-assigned.

The methods of the conventional art are directed to the case where general "text" is the interest of compression. There was conventionally no improvement of text compression where the compression of interest is directed to "description text (the portion other than the heading such as definitions and pronunciations) of a dictionary incorporated in an electronic dictionary".

SUMMARY OF THE INVENTION

An object of the present invention is to provide a text compression dictionary generation apparatus that can generate a statistic dictionary for compression by which a high compression rate can be obtained with respect to fixed text of a large capacity.

Another object of the present invention is to provide a text compression apparatus that can significantly improve the compression rate of text constituted by a plurality of portions differing in description content.

A further object of the present invention is to provide a text compression apparatus that can improve the compression rate of a character string that has locally high frequency of occurrence.

Still another object of the present invention is to provide a recording medium in which a program is recorded for generating a static dictionary for compression by which a high compression rate can be obtained with respect to fixed text of a great capacity.

According to an aspect of the present invention, a text compression dictionary generation apparatus for generating a dictionary referred to in compressing text includes: a frequency guideline calculation unit for calculating, with respect to a target compression rate, a frequency guideline for each character string having a length of at least 2 characters, required to occur in the text to meet the target compression rate; a long character string cutout unit for cutting out a character string having a length of at least 2 characters from the text and that occurs at a frequency meeting the corresponding frequency guideline of a character string, together with its actual frequency in the descending order of the length of the character string to generate a first static dictionary, and generating a group of the remaining text not cut out and not meeting the frequency guideline; a 1 character symbol extraction unit for counting the frequency of each character in a character string having a length of 1 character from the group of the remaining text not cut out to generate a second static dictionary; and an eventual static dictionary build up unit for generating an eventual static dictionary by adding the second static dictionary to the first static dictionary.

By adding the second dictionary generated from the remaining text not cut out to the first static dictionary generated by cutting out character strings that meet the target compression rate from the source text in the descending order of the string length, an eventual dictionary is generated. A static dictionary is generated compressing a character string of that occurs at high frequency in the source text and that meets the target compression rate. As a result, a static dictionary can be generated by which a high compression rate is obtained with respect to fixed text of a large capacity.

Preferably, the text compression dictionary generation apparatus further includes a character string cutout unit for decomposing a character string in the eventual static dictionary and which is a combination of another character string in the eventual static dictionary into a plurality of other character strings including the longest character string, and deleting the original character string that is decomposed, and increasing the actual frequency of respective other character strings by the frequency of the deleted character string.

In decomposing the combination of another character string in the character string in the static dictionary for the purpose of reducing the size of the static dictionary, it is decomposed into a plurality of other character strings that includes the longest character string. Therefore, degradation in the compression rate is minimized while reducing the size of the static dictionary.

The text compression dictionary generation apparatus can further include a character string cutout unit decomposing a character string in the eventual static dictionary and which is a combination of another character string in the eventual static dictionary into a plurality of other character strings that contribute greatest to increasing the compression rate, and deleting the original character string that is decomposed, and increasing the actual frequency of respective other character strings by the frequency of the deleted character string.

In decomposing the combination of another character string in the character strings of the static dictionary for the purpose of reducing the size of the static dictionary, decomposition is carried out so that contribution to increase the compression rate is greatest. Therefore, degradation in the compression rate is minimized while reducing the size of the static dictionary.

According to another aspect of the present invention, a text compression apparatus includes: a common dictionary generation unit for dividing a plurality of text, each formed of a plurality of types of structural elements differing in attribute and sharing at least some of the structural element type, for each structural element type, and generating a common dictionary including a symbol that designates switching of the structural element type and located at respective boundaries of the structural element type with respect to each divided text of a structural element type; and a common dictionary switch compressor-expander unit for compressing-expanding text of interest while switching the common dictionary generated by the common dictionary generation unit according to every encountered symbol.

Text compression-expansion is carried out according to a common dictionary including a structural element type shared by a plurality of text and a symbol that designates switching of the structural element type, located at the boundary of a structural element type. Thus, compression-expansion can be carried out with a dictionary smaller in size than in the case where a static dictionary is generated for each of the plurality of text.

According to a further aspect of the present invention, a text compression apparatus includes: an offset substitution compression unit to substitute a word of locally high frequency in the text with an introduction symbol which is a character string not present in the text from the second occurrence onward, the first occurrence position of the word of high frequency, and a character string length from the occurrence position of the word of high frequency for coding; and an offset substitution expansion unit to expand by substituting the data compressed by the offset substitution compression unit with a word specified by the first occurrence position succeeding the introduction symbol and the character string length from the occurrence position to restore the compressed data into original text.

The code length of the code substituted with the introduction symbol, the first occurrence position, and the character string length from the occurrence position is shortened as to a word of local high frequency since the number of occurrences of the word of high frequency is high. Therefore, the compression rate can further be improved.

According to a further aspect of the present invention, in a recording medium in which a program is recorded of a text compression dictionary generation method for generating a dictionary that is referred to in compressing text, a text compression dictionary generation method includes: a frequency guideline calculation step for calculating, with respect to a target compression rate, a frequency guideline for each character string having a length of at least 2 characters, required to occur in the text to meet the target value; a long character string cut out step for cutting out a character string having a length of at least 2 characters from the text and that occurs at a frequency meeting the corresponding frequency guideline of a character string, together with the actual frequency in the descending order of the length of the character string to generate a first static dictionary, and generating a group of the remaining text not cut out and not meeting the frequency guideline; a 1 character symbol extraction step for counting the frequency of each character in the character string having a length of 1 character from the group of the remaining text not cut out to generate a second static dictionary; and an eventual static dictionary build up step for generating an eventual dictionary by adding the second static dictionary to the first static dictionary.

A program is executed to generate an eventual dictionary by adding the second static dictionary generated from the group of the text not cut out to the first static dictionary generated by a character string that meets the target compression rate. Therefore, a dictionary including a character string of a high compression rate that meets the target compression rate is generated. As a result, a static dictionary is generated by which a high compression rate is achieved with respect to fixed data of a large capacity.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A–3C are diagrams for describing a long character sting cutout unit according to the first embodiment.

FIGS. 4A–4G are diagrams for describing an illustrative process by the long character string cutout unit according to the first embodiment.

FIGS. 5A–5C are diagrams for describing an illustrative process by the long character string cutout unit according to the first embodiment.

FIGS. 7A and 7B are diagrams for describing an illustrative process by an efficiency indicating function value sequential character string cutout unit according to the first embodiment.

FIGS. 8A–8G are diagrams for describing a 1 character symbol extraction unit according to the first embodiment.

FIGS. 10A–10F are diagrams for describing an illustrative process by a character string cutout unit for deleting a symbol according to the first embodiment.

FIGS. 16A and 16B are diagrams for describing an illustrative process by the dictionary generation unit for each structural element type according to the second embodiment.

FIGS. 17–20 are diagrams for describing an illustrative process by the dictionary generation unit for each structural element type according to the second embodiment.

FIGS. 21A and 21B are diagrams for describing an illustrative process of the dictionary generation unit for each structural element type according to the second embodiment.

FIGS. 24A–24D are diagrams for describing an illustrative process of the common dictionary generation unit according to the second embodiment.

FIGS. 25A–25D are diagrams for describing an illustratived process of a common dictionary generation unit according to the second embodiment.

FIGS. 26–28 are diagrams for describing an illustrative process by the common dictionary generation unit according to the second embodiment.

FIGS. 34A and 34B are diagrams of an illustrative process by the offset substitution compression unit according to the second embodiment.

FIGS. 35A–35D are diagrams for describing an illustrative process of the offset substitution compression unit according to the second embodiment.

FIG. 36 is a diagram for describing an illustrative process by the offset substitution compression unit according to the second embodiment.

FIGS. 41A and 41B are diagrams for describing an illustrative process by the number substitution compression unit according to the second embodiment.

FIGS. 42A–42D are diagrams for describing an illustrative process by the number substitution compression unit according to the second embodiment.

FIG. 43 is a diagram for describing an illustrative process of the number substitution compression unit according to the second embodiment.

DESCRIPTION OF THE PREFERRED EMBODIMENTS

Embodiments of the present invention will be described hereinafter with reference to the drawings.

First Embodiment

Figure 1A:
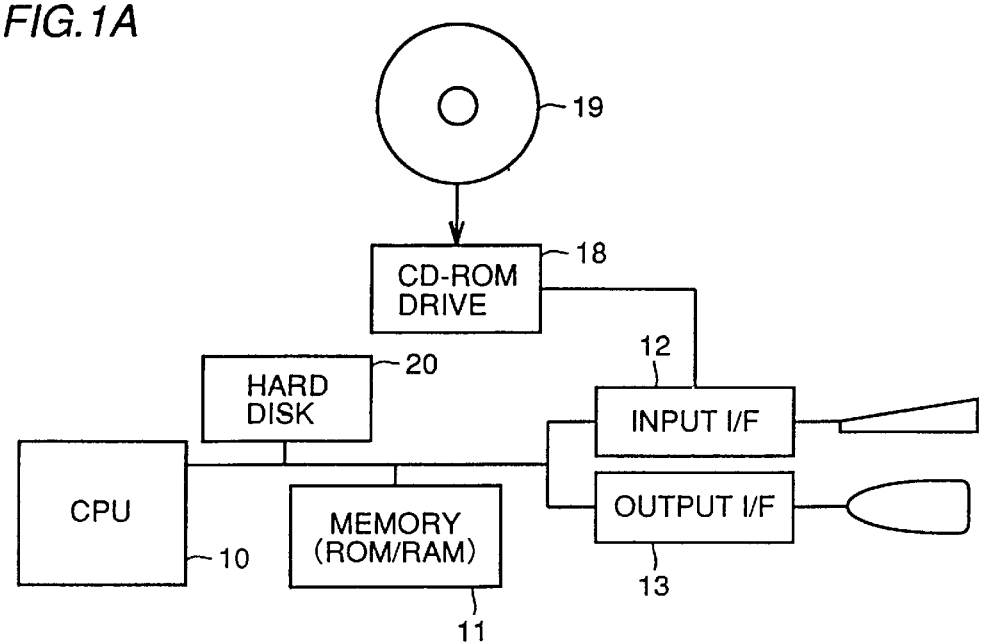
FIGS. 1A–1C show the entire structure of a text compression dictionary generation apparatus according to a first embodiment of the present invention.
Figure 1B:
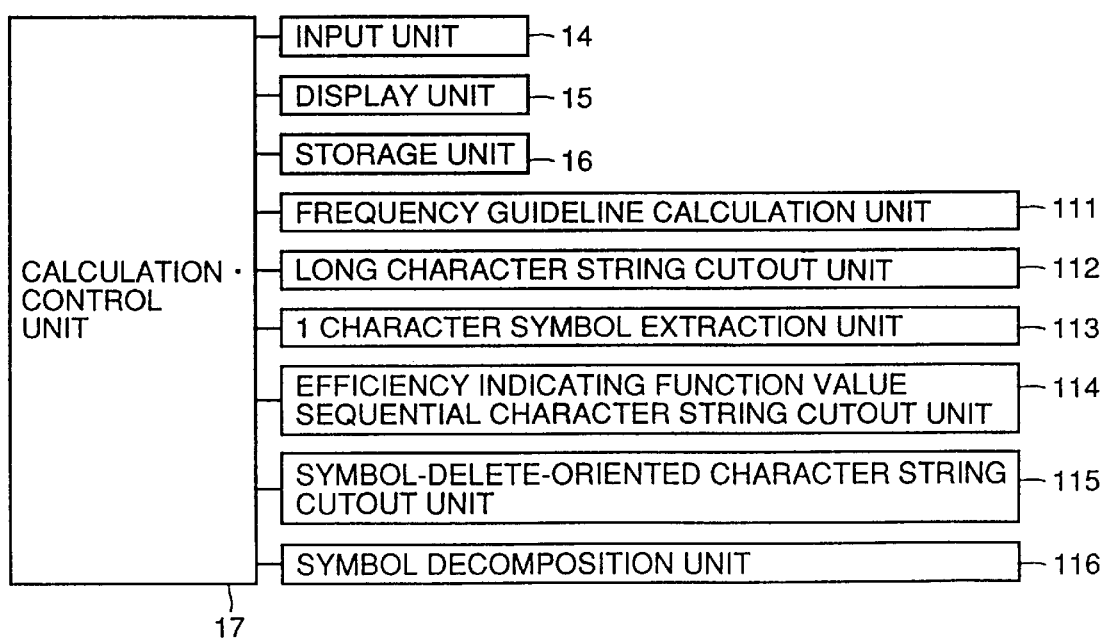
Figure 1C:
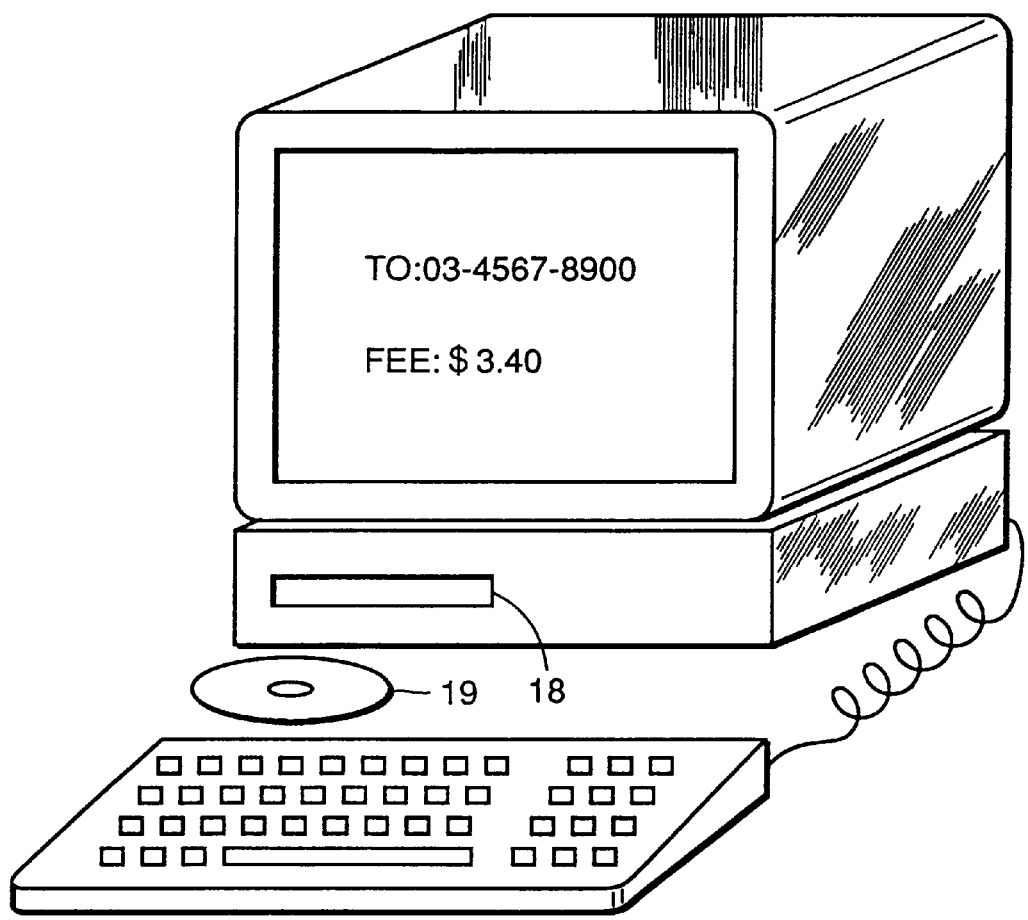

FIGS. 1A, 1B and 1C show an example of a block structure for implementing the present invention in correspondence with the structure of the apparatus.

Referring to FIG. 1A, a text compression dictionary generation unit includes an input interface 12 connected to an input device, a CD-ROM DRIVE 18 connected to input interface 12 for setting a CD-ROM 19, an output interface 13 connected to a display device, a memory 11 including a ROM and a RAM (Random Access Memory), a hard disc 20, and a CPU (Central Processing Unit) 10.

Referring to FIG. 1B, an input unit 14 is formed of input interface 12 that provides data transfer between the main body side of the apparatus and a well-known input device such as a keyboard, an OCR (Optical Character Reader) and a pen. Input of the fixed "source text" to be compressed which is the input of the present invention is entered via input unit 14.

A display unit 15 is formed of an output interface 13 that provides data transfer between the main body side of the apparatus and a well-known output device such as a liquid crystal display, a CRT (Cathode Ray Tube) and the like. The contents of "a static dictionary for compression with respect to source text" and various processing results which are the output of the present invention are displayed via display means.

Storage unit 16 is a well-known element that provides storage and access to a memory device 11 formed of a ROM and a RAM. Various data such as input/output data, temporary data during a process, and process logic are stored in the ROM and RAM.

A frequency guideline calculation unit 111 is a logic for calculating the cutout frequency of each symbol in a compression static dictionary to be output for each character string length with respect to input source text and compression specification to satisfy a given compression specification. This logic is stored in an area of the ROM of memory device 11 in a format that can be processed by a CPU 10.

A long character string cutout unit 112 is a logic for cutting out a symbol of a character string having a length of at least 2 characters in a compression dictionary to be output from the source text together with the actual frequency in the descending order of the character string length, with respect to input source text and a specified frequency for each character string length, and simultaneously generating a group of the remaining text not cut out and not meeting the specified frequency. Long character string cutout unit 112 is stored in an area of the ROM of memory device 11 in a format that can be processed by CPU 10.

A 1 character symbol extraction unit 113 is a logic for counting the frequency of a character having a character string length of 1 with respect to the input text. This logic is stored in an area of the ROM of memory device 11 in a format that can be processed by CPU 10.

An efficiency indicating function value sequential character string cutout unit 114 is a logic for cutting out a symbol having a character string length of at least 2 characters of the compression static dictionary to be output with respect to the input source text and specified frequency for each character string length in the descending order of the character string length×frequency of occurrence from the source text together with the actual frequency. This logic is stored in an area of the ROM of memory device 11 in a format that can be processed by CPU 10.

A character string cutout unit 115 for deleting a symbol (referred to as "symbol-delete-oriented character string cut out unit" hereinafter) is a logic for reducing the capacity of the original compression static dictionary while suppressing increase of the compression amount of the source text by decomposing a particular symbol in a temporarily-generated compression static dictionary into a plurality of other symbols so that other symbols of a greater length are included, and deleting the original symbol. This logic is stored in an area of the ROM in memory device 11 in a format that can be processed by CPU 10.

A symbol decomposition unit 116 is a logic for reducing the capacity of the original compression static dictionary while minimizing increase in the compression amount of the source text by decomposing a particular symbol in the temporarily-generated compression static dictionary into a plurality of other symbols in the static dictionary so that the contribution to increasing the compression rate is maximized. This logic is stored in an area of the ROM of memory device 11 in a format that can be processed by CPU 10.

A calculation•control unit 17 functions to read out data in memory device 11 to interpret and execute the logic while controlling other means. CPU 10 functions as a corresponding apparatus.

Frequency guideline calculation unit 111, long character string cutout unit 112, 1 character symbol extraction unit 113, efficiency indicating function value sequential character string cutout unit 114, symbol-delete-oriented character string cutout unit 115, and symbol decomposition unit 116 are supplied by CD-ROM 19. Copies of these units are fixedly provided in hard disc 20. They may be read out from hard disc 20 into an area of the RAM in memory device 11 during execution.

Figures 2A, 2B, 2C:
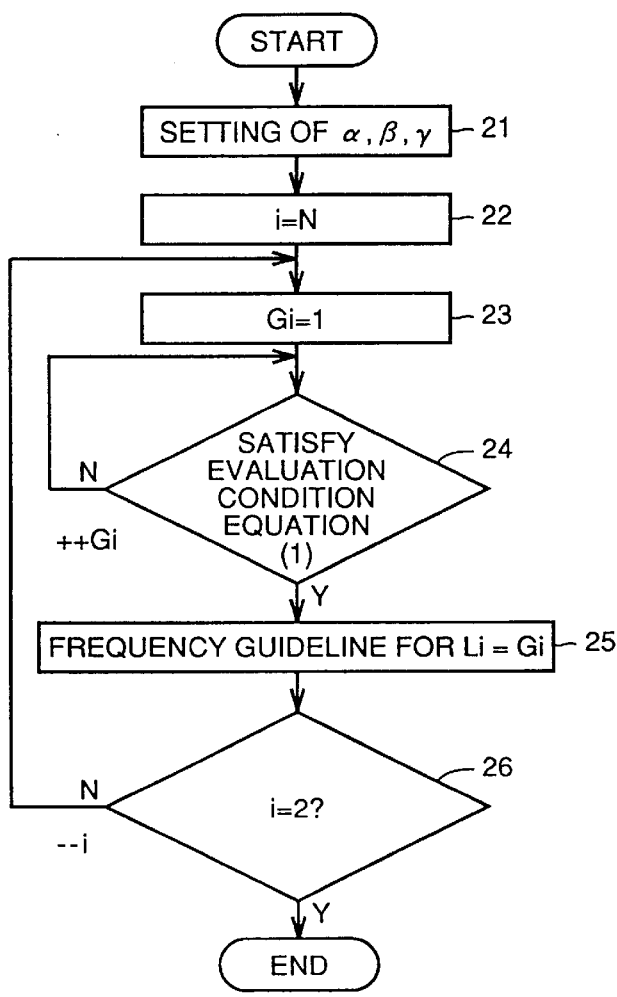
FIGS. 2A–2C are diagrams for describing a frequency guideline calculation unit according to the first embodiment.

Referring to FIG. 2A, input of frequency guideline calculation unit 111 includes "expected number of words of static dictionary (number of symbols) SN", "target compression rate RT (0<RT<1)", "coding factor ($\beta,\gamma$)", and "maximum symbol character string length N of". The output is "minimum value Gi of frequency with respect to symbol of character string length Li (i=N, N−1, . . . , 2) required to satisfy target compression rate".

According to the output results, "specified frequency value for each character string length (=smallest value of frequency)" which is the input of long character string cutout unit 112 or efficiency indicating function value sequential character string cutout unit 114 can be obtained.

A specific example of the method of calculating the smallest value Gi of frequency with respect to the symbol of character string length Li is set forth in the following. Using the following "evaluation condition equation" (1), Gi satisfying this condition equation is calculated according to the flow chart of FIG. 2B.

$$(\gamma*Li+\beta-Gi*\log 2(Gi/\alpha*SN)/8)/Gi*Li=<RT \qquad (1)$$

The denominator of the left-hand member of evaluation equation (1) is the number of bytes in the source text occupied by a particular symbol S when S of a length Li occurs Gi times in the source text. The numerator indicates the number of bytes in the compressed data occupied by S' when S is compressed and coded into code S' of a length L'(<Li). The value of the left-hand member represents the compression rate associated with S. Therefore, the value of the left-hand member must be not more than the input target compression rate RT (=right-hand member of equation).

The reason why the numerator of the left-hand member indicates the number of bytes in the compressed data is set forth in the following.

When statistical compression is carried out, the number of bits for identifying data which has an occurrence probability of p is −log (p) bits according to Shannon's definition on the amount of information. The occurrence probability of S in the static dictionary is represented by the ratio of Gi which is the frequency of S with respect to the total sum Fsum of the frequency of all the symbols. Although depending upon the scale of the static dictionary and the type of source text of interest, the number of bits for identifying S, i.e. the logic code length of S' subjected to a statistical compression method can be provided by $-\log(Gi/Fsum)$ bits if a rough value of Fsum according to the scale of the static dictionary is applied.

From the result of various experiments carried out with respect to the method of the present invention, it is known that total sum Fsum which is the frequency of a compression static dictionary having a number of symbols of approximately 10K is $Fsum=\alpha*SN$ ($\alpha$=approximately 20–60) with respect to general text data of the scale of 300K to 3M bytes. In the present description, the value of $\alpha$ is referred to as "frequency total factor". Since it is difficult to estimate the value of $\alpha$ (the value of Fsum) accurately prior to building up a static dictionary, a particular value is set using an empirical value in the present invention.

In view of the foregoing, it is known that the second term of the numerator of the left-hand member of equation (1) represents the total number of bytes in the compressed text occupied by S'.

An expansion table corresponding to the static dictionary is additionally required when compression is carried out using a static dictionary in order to expand compressed text and restore the same into the original source text. The size of the expansion table depends on the coding method, and differs according to the compression-expansion module. The number of bytes in the data for expansion occupied by S can be calculated by respectively estimating the search table size per 1 symbol and the size of the character string when a character string of symbols are stored according to the data structure of the "expansion module" utilizing the compression static dictionary.

Assuming that $\beta$ is the factor representing the size of a search table per 1 symbol, and $\gamma$ is the calculated factor of the buffer size corresponding to a character string length for storing a character string of symbols ($\beta$ and $\gamma$ can be calculated if the compression-expansion module is determined), the number of bytes in the data for expansion occupied by S is $\gamma*Li+\beta$ as shown by the first term in the numerator of the left-hand member.

The calculation method of FIG. 2B is a simple algorithm taking advantage that the left-hand member of equation (1) is a monotone decreasing function of Gi. The values of $\alpha$, $\beta$, and $\gamma$ are set (21). Starting from Gi=1 (22), a value is set for Gi in equation (1) to calculate whether (1) is actually satisfied (23). If it is not satisfied, Gi is incremented by 1 to repeat the process until the value of Gi satisfies equation (1) (24). The first value of Gi satisfying equation (1) becomes the "specified frequency guideline value" with respect to Li (25).

This process is repeated from i=N to i=2. The value of Gi is obtained for each character string length (26), and output as the result.

An example of values calculated according to this algorithm is shown in FIG. 2C.

Figure 3B:
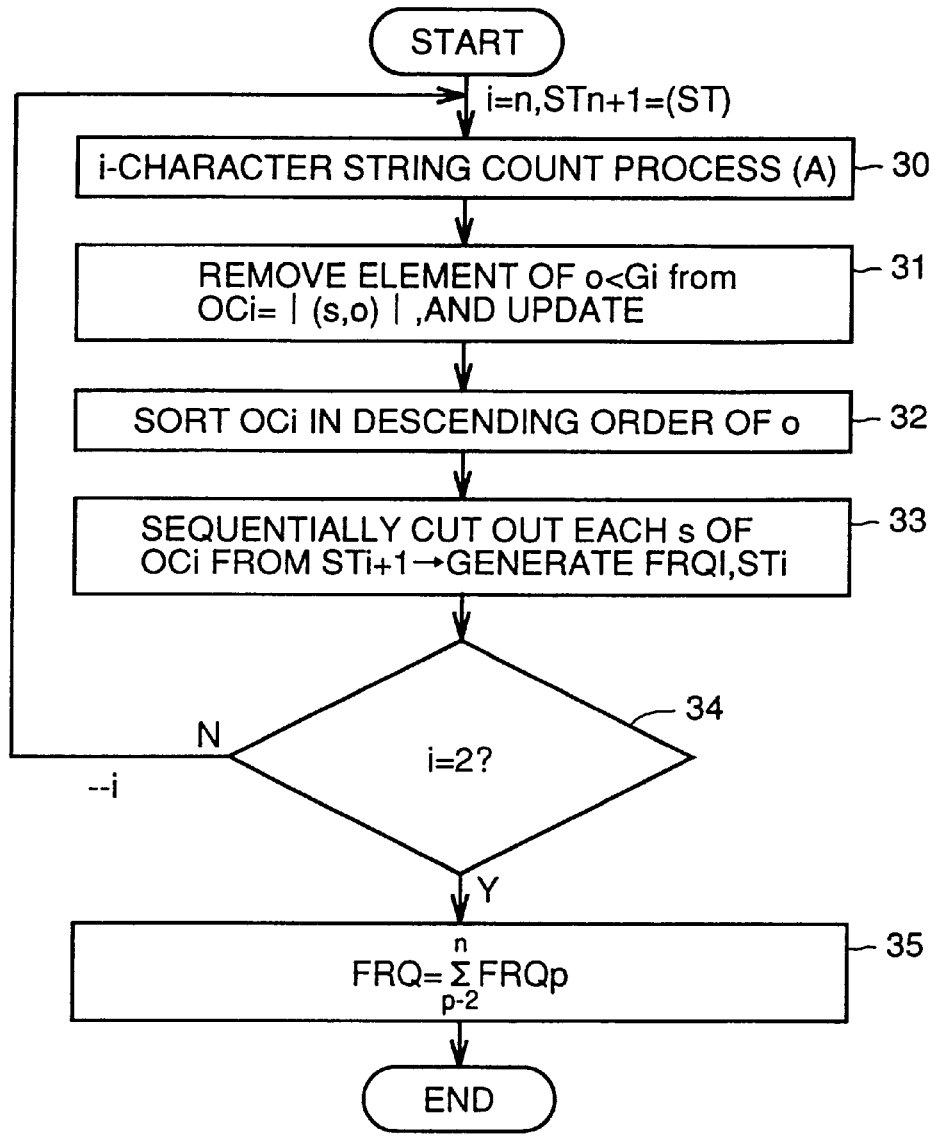
Figure 3C:
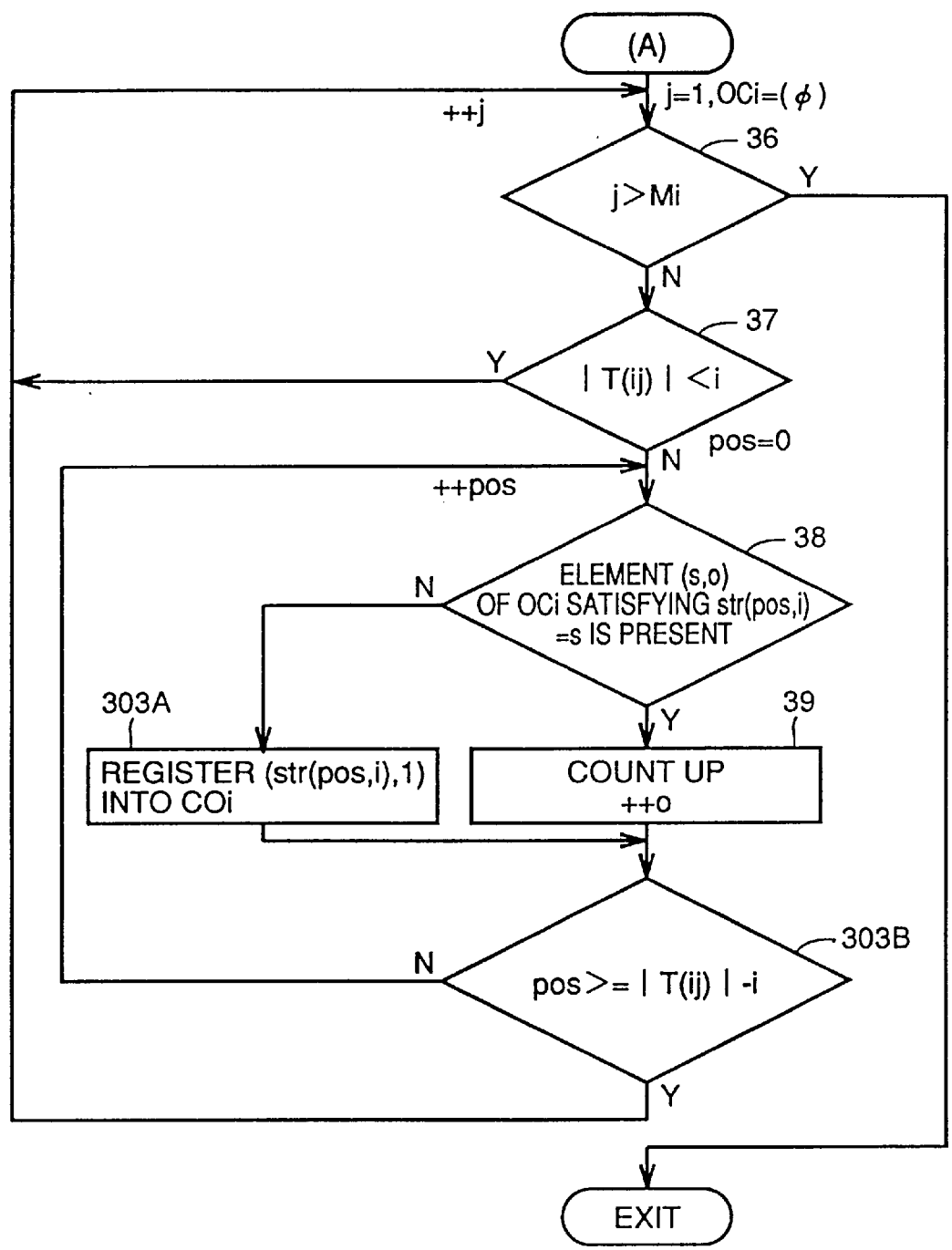

Referring to FIGS. 3A–3C, an example of implementation and process of long character string cut out unit 112 will be described hereinafter.

The input of long character string cutout unit 112 includes fixed "source text" which is the interest of compression, maximum character string length n of the symbol in a static dictionary "(>1)", and "frequency value Gi (i=N, ..., 2) for each character string length". Although the results of frequency guideline calculation unit 111 can be used as a reference value for Gi, there is basically no limitation in the providing manner of values Gi and N.

The output of long character string cutout unit 112 is a portion of the compression static dictionary used for compressing source text in high efficiency. The data structure of the compression static dictionary is a group of "a pair of a symbol and frequency thereof". A group of "a pair of a symbol having a character string length of at least 2 characters and frequency thereof" is obtained by long character string cutout unit 112.

In the process of cutting out a long character string, a group of character strings having the character length of i (indicated as "i-character string" hereinafter), become the basis of a registration symbol in a static dictionary. Then, a group of i-character strings meeting the frequency is actually cut out from the source text. Next, a frequency table FRQi of the symbol of character string length i is built. A similar process is repeated for a group STi which is the remaining text not cut out meeting the frequency to sequentially build up respective frequency tables FRQi–1, ..., FRQ2.

Referring to FIG. 4A, input text is shown in an illustrative process 303C. Referring to FIG. 4B, a illustrative process 303D shows the longest character string length n of the input symbols. Referring to FIG. 4C, a illustrative process 303E shows input specified frequency values G8, ..., G2.

A plurality of input source text can be provided. This means that a group of text can be processed. However, when processing is formed from a group of text, symbol cut out which bridges the text cannot be carried out.

Starting from i=N, an i-character string count process is applied on the input text. This process is carried out for each text with respect to a group of text. An i-character string is counted from the beginning to the end of the text (strictly speaking, to the position of text length –i) while shifting the position one character at a time.

More specifically, as shown in the flow chart of FIG. 3C, starting from the state of OCi=$\phi$, pos=0 (text head position) where OCi={(string, occurrence)} is the group of a pair of an i-character string and a count value thereof, detection is made whether a character string of a length i, i.e. str (pos, i) with pos1 as the beginning position is already registered in OCi. If it is already registered, the value of occurrence of that element is incremented by +1. If it is not yet registered, (str (pos, i), 1) is newly registered as the element of OCi (38, 39, 303A). This process is repeated up to the position of character length –i while counting up the value of pos (303B). A similar process is carried out for each text when there are a plurality of text (36). Any text having a text length shorter than i is outside the range of processing interest (37).

According to the above-described process, a group of candidates of symbols having a character string length of i to be registered in a static dictionary is obtained.

Referring to 303C of FIG. 4A, a 8-character string is sequentially counted and extracted having each character shifted at a time from source text ST according to a 8-character string count process. More specifically, "辞書の本, 体デー", "辞書の本体データ", "書の本体データや", ... are extracted.

If there are expressions such as "辞書の本体データと ...", "辞書の本体データの ...", and "辞書の本体データに" in another area in source text ST, the number of occurrences of the 8-character string of "辞書の本体データ" will be counted up to a considerable number. In contrast, if the expression of " ... 書の本体データや" occurs only once at "辞書の本体データや ...

" in the exemplified ST of 303C, the occurrence count of the 8-character string of "辞の本体データや" remains at 1.

Referring to FIG. 4D, illustrative process 303F is an output of a 8-character string count process carried out on source text ST. By this way of counting, the group of i-character strings can be counted properly without any overlooking and duplication.

Upon completing the 8-character string count process, the program returns to the long character string cutout process.

The elements of OC8 generated as a result of the 8-character string count has various frequency values as shown in 303F in FIG. 4D, values exceeding G8 and values less than G8. In the case where the ST frequency table is cut out while fulfilling the condition of specified frequency Gi according to the element of OCi, any element having an occurrence count equal to or less than Gi (in the case of i=8, (process 303F), corresponding to elements labeled with x) is removed in advance from the object of the "cut out" process (31 in FIG. 3B) from the standpoint of processing efficiency.

Referring to FIG. 3B again, OCi is sorted in order from one having a higher occurrence count (32) according to the heuristics of "cutting out a character string of higher frequency (longer character string) as possible" from the standpoint of compression efficiency.

Upon updating the contents of OCi as described above, the character string registered in OCi is cut out from the group of the text of interest STi+1 (33).

The STi+1 "cut out" process for each element (s, f) of OCi is carried out as follows.

It is assumed that the character string which is the object of each process is $T(i+1, j) \in STi+1$ (j=1, ..., Mi+1).

(1) A partial character string matching s is processed sequentially from the head position of each character string to be processed of T(i+1, j).

(2) When the first s is found in ". . . , s, . . . " which is the character string to be processed of T(i+1, j), the partial character string in T(i+1, j) preceding s is set as TT(i+1, k) (k is counted up each time it is found), and the frequency of s is counted up just by 1 (initial value 0).

When s is not found, TT(i+1, k)=T(i+1, j).

(3) Using a partial character string T(i+1, j) succeeding s as the character string to be processed, the processes of (1) and (2) are repeated until there are no more character strings to be processed.

(4) T(i+1, j) is updated with T(i+1, j)←{TT(i+1, k)}. The character string to be processed is registered in a form divided by s.

(5) After applying the process with respect to all T(i+1, j), (s, f') is registered in FRQi if frequency f' of s is at least Gi.

If f'<Gi, no registration is provided to FRQi, and T(i+1, j) is restored to the state prior to cut out.

After carrying out the above (1)–(5) to all the elements of OCi, STi is generated with T(i, k)=TT(i+1, k).

Figures 4E, 4F, 4G:
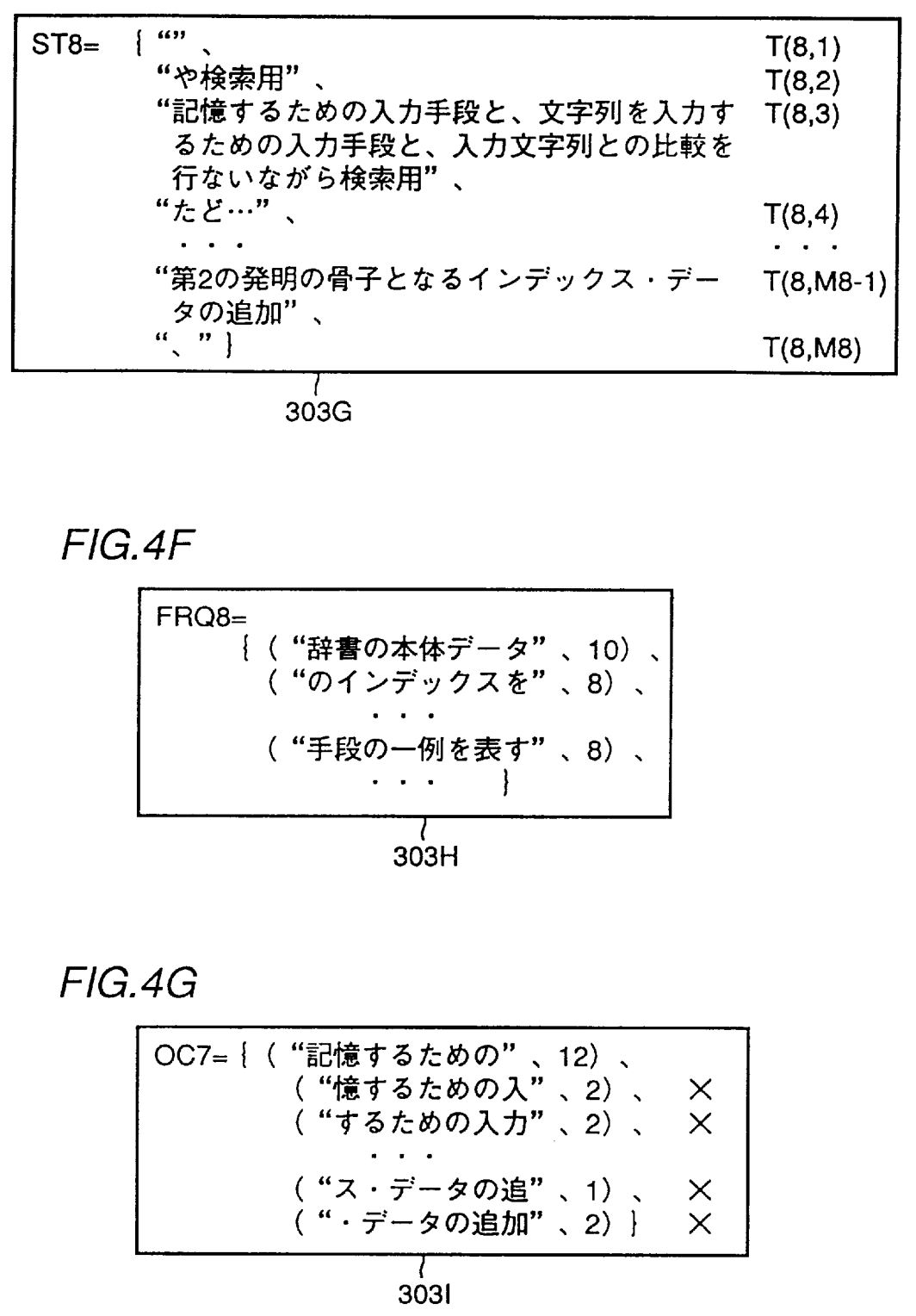

Referring to FIG. 4F, 303H is a cutout output (frequency table FRQ8 of the 8-character string) in which OC8 meeting the specified frequency value is sorted in the order of occurrence count with T(9, 1)=ST.

"辞書の本体データや検索用のインデックスを記憶 . . . " which is the beginning portion of ST (=ST9) is divided into the portions of " " and "検索用のインデックスを記憶 . . . " by the cut out of element "辞書の本体データ" of OC8. This new text to be processed is further divided into the portions of " ", "検, 索用", "のインデックスを", "記憶 . . . ", by the cutout of element "の インデックスを" of OC8.

The "remaining text not cut out" after the cut out process is applied on all the elements of OC8 becomes the text to be processed ST8={T(8, j)} of the object to be cut out of the next OC7 (see FIGS. 4E and 4G) (303G).

Referring to FIG. 3B again, the i-character string count process and the cutout process with respect to the remaining text not cut out are repeated until i=n, ..., 2 (34). Then the group of FRQi is combined to generate a frequency table for a character string having at least 2 characters and a group of remaining text not cut out ST2 are generated (35). The illustrative processes of 303J and 303K are shown in FIGS. 5A–5C respectively.

Figures 6A, 6B:
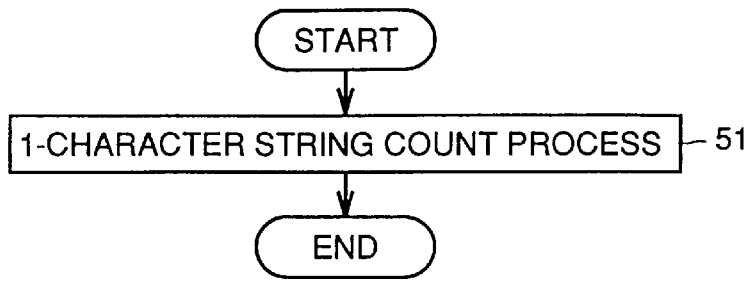
FIGS. 6A and 6B are diagrams for describing an efficiency indicating function value sequential character string cutout unit according to the first embodiment.

Referring to FIGS. 6A and 6B, an example of implementation of 1 character symbol extraction unit 113 will be described hereinafter.

The input of 1 character symbol extraction unit 113 is a group of remaining text not cut out according to the character string cutout process. The output is the frequency table of a character unit included in the input text.

Referring to FIG. 6B, a 1-character count process is applied to a group of text to be processed T (51). The resultant group of the pair of "1-character symbol, occurrence count" directly becomes a frequency table FRQ1 of the processed result.

By combining frequency table FRQ generated by long character string cutout unit 112 and frequency table FRQ1 extracted by 1 character symbol extraction unit 113, a static dictionary ST for compression which is the eventual result is obtained.

$$ST = FRQ + FRQ1$$

An example of implementation and processing of an efficiency indicating function value sequential character string cut out will be described hereinafter.

The input and output of efficiency indicating function value sequential character string cutout unit 114 are identical to those of long character string cutout unit 112. More specifically, the input includes a fixed "source text" which is the object of compression, "maximum symbol character string length N(>1) in a static dictionary", and "specified frequency value Gi (i=n, ..., 2) for each character string length. The output includes a "compression static dictionary for a character string length of at least 2" for compressing source text at high efficiency.

The logic of long character string cutout unit 112 is a method for sequentially cutting out a character string as long as possible from the source text. In contrast, the logic of efficiency indicating function value sequential character string cutout 114 is a method using not only the character string length as an index, but preparing in advance a function representing some compression efficiency exponent taking account of the number of occurrences to cut out the symbol of the static dictionary in the descending order of this function value.

This method envisages the case where the compression rate is improved by cutting out a character string of a short length and of high frequency than cutting out a character string of a long length and low frequency.

It is a difficult problem to find a function that accurately provides an efficiency exponent. Since the total number of occurrences for all symbols cannot be identified, i.e. a precise occurrence probability cannot be identified, until the cutout process of the static dictionary is completed, it is difficult to estimate the precise compression efficiency of a character string just by "a character string length X" of a symbol candidate character string and from "the number of occurrences thereof Y" calculated during the cutout process.

However, it is possible to provide a rough index of the compression rate. An example of a function providing that rough compression efficiency is set forth in the following.

A total sum S of a code length after compression of a character string with a character string length of X and occurrence count of Y can be expressed as S=−Xlog2(Y/FSum) with FSum as the total number of frequency of occurrence after the cutout.

Assuming that the compression efficiency of 1 symbol has "a great difference between the total sum of the original character string length and the total sum of the code length after compression, the description of F(X, Y, FSum)=X*Y−S=X*Y+X*log2(Y)−X*log2(FSum) can be provided.

Although not logically correct, by rounding FSum in the actual calculation as "being substantially constant independent of the cut out manner", $$F(X, Y, FSum)=X*(Y+\log2(Y)-\alpha)\approx X*(Y+\log2(Y))$$

can be obtained with α as a constant. Therefore, $$F(X, Y)=X*(Y+\log2(Y))$$

can be set as the function providing the rough compression rate exponent.

Alternatively, a function produced from the standpoint of higher accuracy can be set as the compression efficiency indicating function. In some cases, efficient cut out can be effected by cutting out a character string sequentially in the descending order of the number of characters occupied in the source text with F(X, Y)=X*Y.

Referring to FIG. 7A, description of the processing procedure will be provided without particularly defining a compression efficiency indicating function. It is assumed that ST is the source text, Gi is the specified frequency of an i-character string, n is the longest symbol character string length, OC is the result of the i-character string count process from n to 2, OCC is the OC sorted in the sequence of the efficiency indicating function value, FRQ is a frequency table generated by cutting out ST with OCC, and STr is the group of the remaining text not cut out.

Referring to FIG. 7B, the i-character string count process on ST is carried out starting from i=n to i=2 (41, 42). The obtained OCn, OCn−1, ..., OC2 are combined (a simple sum of the group), and OC is provided (43).

Any element (s, o) of OC not satisfying the specified frequency condition of o≧G|s| is removed (44) from the standpoint of processing efficiency.

As to element (s, o) of OC, the compression efficiency exponent of character string s is expressed as F(s, o, ...). The number of occurrences o of each (s, o) substituted with F(o, s, ...) is set as OCC (45). OCC is sorted in the descending order of F(o, s, ...), and in the order of the efficiency indicating function value of s (46). Then, the element of OCC is sequentially cut out from ST to obtain FRQ and STr according to a method similar to the process of (34) of FIG. 3B (47).

The processing of efficiency indicating function value sequential character string cutout unit 114 will be described with reference to FIGS. 8A–8G. For the sake of simplifying the description, a simple efficiency indicating function of F(X, Y)=X*Y is taken as an example.

Source text ST of FIG. 8A, maximum symbol length n and specified frequency Gi of FIG. 8C are respectively identical to those shown in FIGS. 4A and 4C. OC8 is the counted process of the 8-character string from the beginning of ST to the location of |ST|−8 while shifting 1 character at a time. The process up to this stage is identical to the long character string cutout process.

In the long character string cutout process, ST is cut out with OC8 to generate a frequency table of the 8-character string and the remaining text not cut out ST8. The process of cutting out-leaving the not-cut-portion is repeated for the remaining text not cut out thereafter. In contrast, in efficiency indicating function value sequential character string cutout unit 114, the approach is taken to find a symbol having a great efficiency indicating function value independent of the character string length. The source text is not cut out with OC8, and first all OCi (i=n, ..., 2) are generated from the source text. The OCi are combined and then sorted sequentially in the order of the efficiency indicating function value.

In the count process from OC7 and et seq., counting of the i-character string is effected from the head to the end of ST (487–482), as in the case of OC8. The OCi are combined, and those not meeting the specified frequency are removed. A portion of the OCC sorted in sequence of the efficiency indicating function value is shown in the illustrative process 49.

The 8-character string of "のインデックスを" in OCC has an efficiency indicating function value of 64 (=8*8). In contrast, the 6-character string of "インデックス" frequently occurs in other areas, and has an efficiency indicating function value of 2394 (=399*6).

Therefore, in efficiency indicating function value sequential character string cutout unit 114, there is a probability that "インデックス" is cut out prior to "のインデックスを" that is cut out in the long character string cut out process. As a result, there is no text including "のインデックスを" in the text to be processed at the time of cutting out "のインデックスを". It will not be registered as a symbol in FRQ (illustrative process 4A). The first character of "の" and the last character of "を" remain in the remaining text not cut out STr (illustrative process 4B). In this case, the frequency of "インデックス" is increased and the code length of "インデックス" is shorter than in the long character string cutout process.

STr generated by efficiency indicating function value sequential character string cutout unit 114 is subjected to a process by 1 character symbol extraction unit 113 to output a 1 character frequency table as in the case of long character string cut out unit. By the sum of this table and frequency table FRQ of a symbol of at least 2 characters, the eventual static dictionary can be obtained.

The specific procedure of the method of cutting out a static dictionary from the text has been described. This method is classified into two types. The first is a combination of long character string cutout unit 112 and 1 character symbol extraction unit 113. The second is a combination of efficiency indicating function value sequential character string cutout 114 and 1 character symbol extraction unit 113.

The size of the compiled static dictionary differs depending upon the contents of the source text. It is not possible to obtain the proper size until the cutout process is executed to actually build up a static dictionary.

When the size of the table for expansion (a table built according to a static dictionary, and having a size proportional to the static dictionary size) is limited at the party where the compression-expansion module is realized, and when the size of the static dictionary obtained by the first cutout process does not satisfy this limitation, a static dictionary smaller in size must be built up.

Even in the case where there is no such limitation, a fixed expansion table corresponding to the static dictionary must be provided at the expander side when the "static dictionary method" is to be used. Therefore, generation of a static dictionary of a size that greatly affects the compression rate must be avoided.

In view of the foregoing, the method described below, is applicable to reduce the number of symbols of the static dictionary without degrading the compression rate of the source text so much.

As a simple method of reducing the number of symbols in a static dictionary, a symbol of a long character length of at least 2 characters and that has low frequency is decomposed into one character symbols, and merged with originally-provided 1 character symbol.

When the entry of ("辞書本体", 4) is to be deleted as to the elements in the static dictionary of ("辞書本体", 4), ("辞", 16), ("書", 16), ("本", 32), and ("体", 8), the symbol of "辞書本体" is decomposed into 1 character each, and ("辞", 4), ("書", 4), ("本", 4), and ("体", 4) are merged with the originally-provided elements of the static dictionary (take the sum of the frequency of the symbol and update the element of the static dictionary). As a result, ("辞", 20), ("書", 20), ("本", 36), and ("体", 12) are obtained. According to this method, there are cases where the coding code of the 1 character symbol is reduced since the frequency count of the 1 character symbol is increased. However, since the frequency count of a 1 character symbol is large in general, the code length is seldom altered even if the frequency slightly increases.

In contrast, by decomposing "辞書の本体データ", for example, into another symbol of "辞書の" and another symbol of "本体データ", the probability of reducing the code length of respective symbols is high corresponding to the increase of the frequency by the decomposition when the number of frequency of the original symbols of "辞書の" and "本体データ" not so high.

It is assumed that the code length of symbol S which is the interest of reduction is L. The code lengths of S1 and S2 are set as L1 and L2 where the static dictionary is updated by the above-described method with symbol S decomposed by the sum of the decomposed symbols S1 and S2 and then deleted. In general, L1+L2>L, so that it is seldom that the sum of the decomposed code length becomes smaller than the original code length.

Therefore, by decreasing the number of symbols, the capacity of the table for expansion can be reliably decreased although there is a slight increase in the amount of the compressed data.

Increase in the compression rate of the source text can be suppressed as much as possible as the number of decomposed symbols is lower, or when the number of decomposed symbols is identical, by selecting a more efficient way of decomposition when there are a plurality of methods of decomposition.

Referring to FIGS. 9A and 9B and 10A–10F, implementation of the symbol-delete-oriented character string cutout unit 115 and an illustrative process thereof will be described hereinafter.

The input of symbol-delete-oriented character string cutout unit 115 includes the compression static dictionary with respect to the source text and the elements to be deleted from the static dictionary, which are already obtained. The output is the new compressed static dictionary having the appropriate elements deleted with degradation in the compression rate of the source text suppressed as much as possible.

For the sake of simplification, the case where one character symbol covers all the types of characters in the source text will be described.

In symbol-delete-oriented character string cutout unit 115, a "character string cut out process" is applied on the symbol which is the element to be deleted by a group of symbols sorted in the descending order of the character string length and having a character string length shorter than that of the element to be deleted. The decomposition method of including a longer symbol as possible in the group of decomposed symbols is employed.

The process describes the procedure for one element to be deleted. When a plurality of elements are to be deleted at one time, this procedure is to be repeated for the corresponding number of elements.

Figures 9A, 9B:
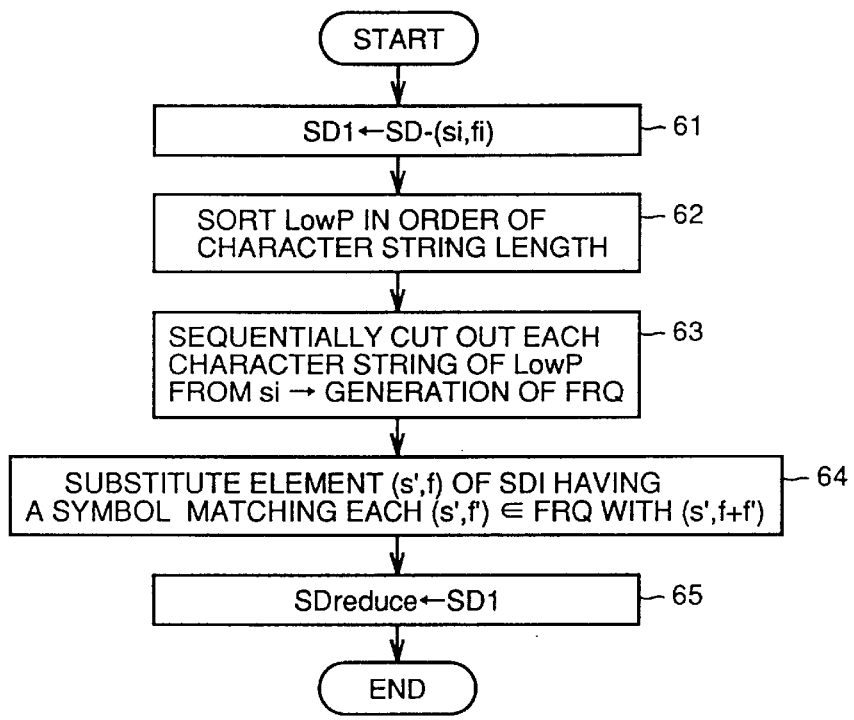
FIGS. 9A and 9B are diagrams for describing a character string cutout unit for deleting a symbol according to the first embodiment.

Referring to FIG. 9B, an element to be deleted (si, fi) is removed from static dictionary SD. A partial group LowP of the static dictionary formed of elements having a character string length shorter than the character string length of p of the element to be deleted is sorted in the descending order of the character string length (62).

Each element of LowP is sequentially cut out from si to generate a group FRQ of a decomposed character string of si (63). There is a possibility that text of si not cut out remains. However, since it is assumed that the 1 character symbol registered in the static dictionary covers all type of characters in the source text, si will be entirely decomposed by the symbols of the original static dictionary.

If this assumption is removed, there will be remaining text not cut out. Therefore, this method cannot be applied to symbols that cause remaining text not cut out. However, in practice, a 1-character symbol will cover almost all the types of characters in the source text having a great size of several megabytes. Therefore, almost all symbols can be deleted by this method.

Since FRQ is a cutout of the partial group of SD1, an element having a symbol identical to the symbol of the each element in FRQ is present in SD1. By increasing the frequency corresponding to the frequency fi of the deleted symbol (si, fi) with respect to the element of SD1, the source text is equal to that test cut out by SD1.

This is the reason why the frequency of element (s', f) of SD1 having a symbol in common to each element (s', f') of FRQ is increased by f'*fi (64).

The SD1 updated by having the frequency of all decomposed symbols increased by the deleted symbols becomes the resultant SDreduce of the present process (65).

Deletion of SD element ("記憶", 8) from static dictionary SD is shown according to FIGS. 10A–10F.

SD1 is an illustrative process 67 simply having ("記憶", 8) deleted form SD. LowP is a partial group of SD1 (illustrative process 68) formed of elements of a symbol having a character string length not greater than 7. The cut out text of interest is "記憶" of the symbol of the element to be deleted (illustrative process 69).

The result cut out by text LowP is shown in FRQ illustrative process 6A. From "記憶" cut out of "インデックス", and then "の" and "を" from the remaining text is effected at the frequency of 1 respectively.

The final result SDreduce (illustrative process 6B) is the corresponding elements of SD1, i.e. ("の", 2468), ("インデックス", 388), ("を", 1234) having the frequency respectively increased by 1*8.

Implementation of symbol decomposition unit 116 for deleting a symbol more efficiently and an illustrative process thereof will be described with reference to FIGS. 11A, 11B, 12A–12E and 13.

The input and output of symbol decomposition unit 116 are identical to those of symbol-delete-oriented character string cutout unit 115. More specifically, the input includes a "compression static dictionary" and an "element to be deleted in static dictionary". The output includes a "static dictionary subjected to deletion and update".

In symbol decomposition unit 116, the process of character string cutout is not used. The approach is to detect whether each of decomposed character strings, when decomposed at an arbitrary position, is registered as a symbol in the static dictionary.

By this approach, the number of decompositions that could be identified only after the process in symbol-delete-oriented character string cutout unit 115 can be specified in advance. Also, a candidate that contributes greatest to the compression rate of the source text can be selected from a plurality of decomposition method candidates. Therefore, a more efficient delete process can be carried out from the standpoint of preventing reduction in compression rate.

Due to the limitation of the number of decompositions, there is the case where a symbol that could be decomposed by symbol-delete-oriented character string cutout unit 115 cannot be decomposed. It may become difficult to control the number of symbols to be deleted.

Figures 11A, 11B:
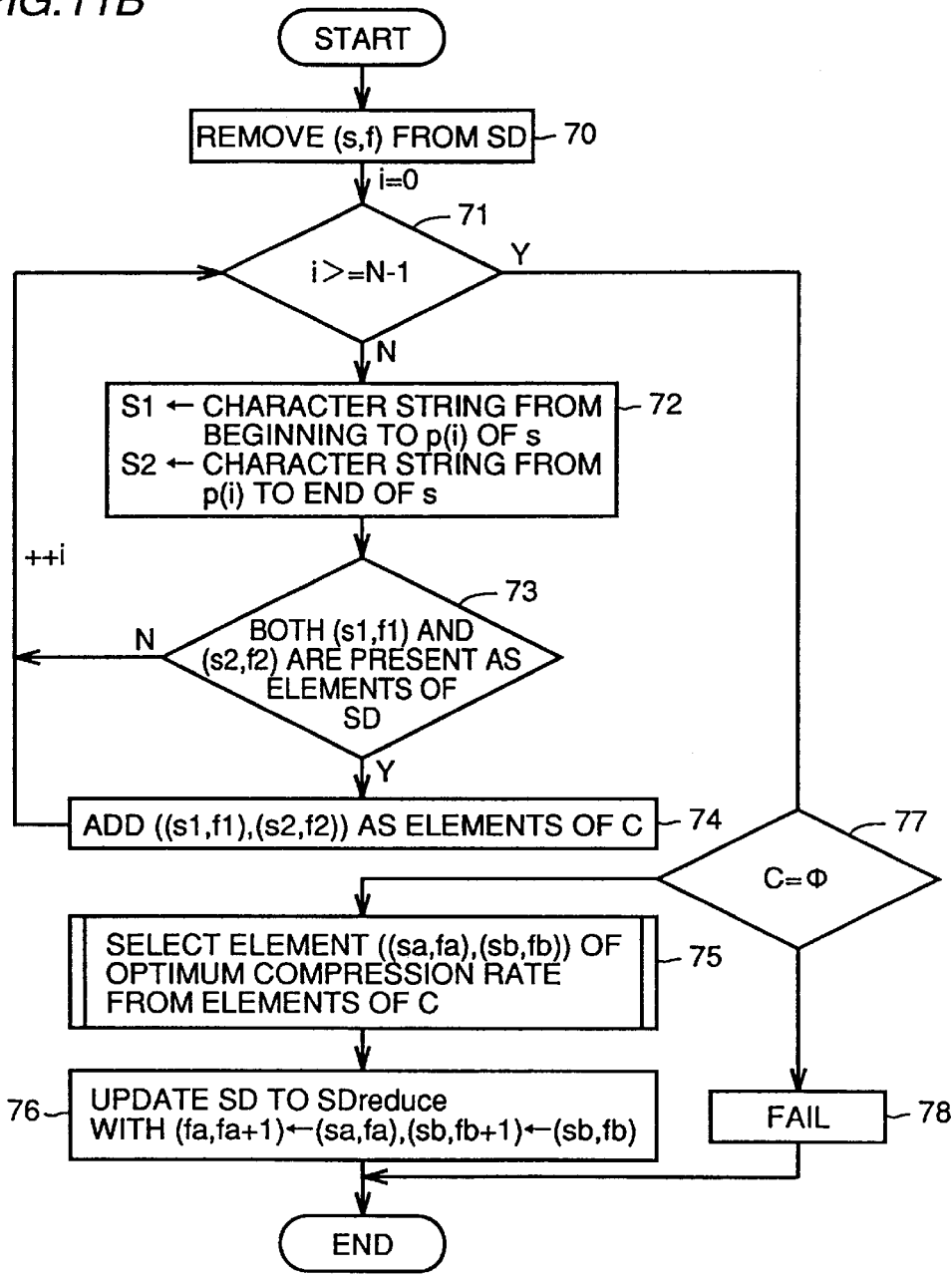
FIGS. 11A and 11B are diagrams for describing a symbol decomposition unit according to the first embodiment.

The process will be described according to the flow chart of FIG. 11B.

In this process, the number of decompositions is set at 2, taking account of decompression efficiency. Although an algorithm for the number of decompositions greater than 2 can be implemented with a slight extension, the compression efficiency will be degraded and the processing time increased. Therefore, it is considered that the case where the number of decompositions is 2 is most practical.

Elements to be deleted (s, f) are removed from static dictionary SD (70). Then, a group C of candidates of the s decomposition method with respect to symbol s (character string length N) which is the object of delete is obtained.

Assuming that the boundary position between the characters in s is 1, . . . , i, . . . , N−1 in sequence from the begining, s is decomposed into a partial character string s1 from the head to i of s and a partial character string. s2 from i to the end of s (72).

If there are elements (s1, f1) and (s2, f2) of SD with symbols S1 and s2 (73), s can be decomposed with an other symbol in the static dictionary. Therefore, (s1, f1), (s2, f2) are registered in a decomposition candidate group C as one decomposition method candidate for s (decomposition at 1*i*) (74).

This operation is repeated (71) until i>n−1 to generate a decomposition candidate group C.

In the case of C=empty group (77), s cannot be decomposed into two symbols. Therefore, this process will fail (78). If C≠empty group (77), the program enters process B (75) for selecting a decomposition symbol candidate from the elements of C that has a high compression rate.

Figures 12A, 12B, 12C, 12D, 12E, 13:
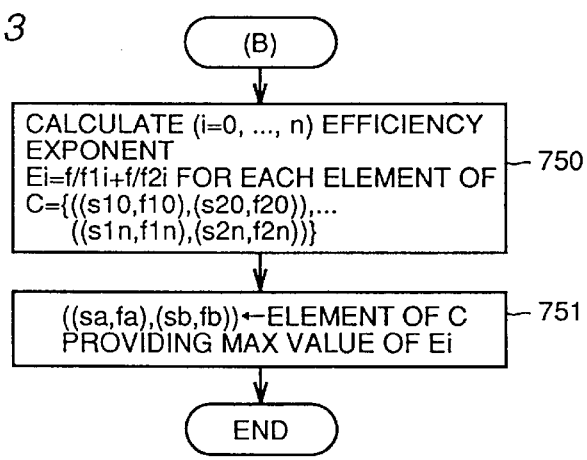
FIGS. 12A–12E are diagrams for describing an illustrative process by the symbol decomposition unit of the first embodiment.
FIG. 13 is a diagram for describing the symbol decomposition unit according to the first embodiment.

The selection process of B is shown in FIG. 13. According to a calculation equation that provides a rough index with respect to each element of decomposition candidate group C, the efficiency exponent E is calculated (750). The element having the greatest efficiency exponent is selected (751).

The calculation for efficiency exponent E is expressed by the following equation.

Efficiency exponent=Σ (frequency of symbol to be deleted)/(frequency of decomposition symbol)  (2)

Since each frequency Fi of the decomposition symbol of the original static dictionary is increased by frequency D of the symbol to be deleted after deletion, the total "Sum" of the frequency will not change before and after deletion. Since the number of bits of each decomposition symbol is:

−log(Fi/Sum) before decomposition; and

−log(Fi+D)/Sum bits after decomposition, the reduced number of bits is:

$$-\log(Fi/\text{Sum})-(-\log((Fi+D)/\text{Sum})=\log(1+D/Fi)$$

Since log(1+D/Fi) is proportional to D/Fi, the static dictionary having a great sum of D/Fi corresponds to the greatest reduction in the bit length, i.e. the highest compression rate. Equation (2) is provided according to this issue.

Referring to FIG. 11B again, the frequency in static dictionary SD with respect to the element in decomposition candidate group C having the highest efficiency exponent selected in this manner is increased by the number of frequencies of the deleted element to obtain a final static dictionary (76).

Static dictionary SD is shown in illustrative process 79 of FIG. 12A. The character string to be deleted and the decomposition position thereof are shown in illustrative process 7A of FIG. 12B. An example of decomposition candidate group C is shown in illustrative process 7B of FIG. 12C.

When decomposed at the decomposition positions of 3 and 5, there are elements in static dictionary SD that have a symbol identical to respective decomposition symbols. Two pairs of decomposition symbols are registered in decomposition candidate group C.

The calculated result of respective efficiency exponents of the two elements of decomposition candidate group C are shown in illustrative process 7C of FIG. 12D. Since the first element has a greater efficiency exponent, the first element is selected as the decomposition symbol. The character string to be deleted "辞書の本体データ" is decomposed into "辞書の" and "本体データ".

Instead of deleting ("体データ", "辞書の本体データ", 10) from static dictionary SD, the respective frequencies of ("辞書の", 8), and ("本体データ", 8) are respectively increased by 10 to obtain a static dictionary SDreduce subjected to deletion (7D).

Thus, according to the text compression dictionary generation apparatus of the first embodiment, a compression dictionary for text data can be provided in an apparatus such as an electronic dictionary or electronic book organizer that requires fixed text data of a great amount.

By generating a module that compresses and expands text data using a compression static dictionary built by the present apparatus, the memory capacity can be reduced significantly to reduce the cost of the product.

The size (number of entries) of the compression static dictionary per se produced by the present apparatus can be adjusted finely without hardly reducing the compression rate of the source text. This means that the memory capacity can be controlled flexibly in mounting a compression expansion module into the product. Therefore, a product can be developed more speedily.

Second Embodiment

Figure 14A:
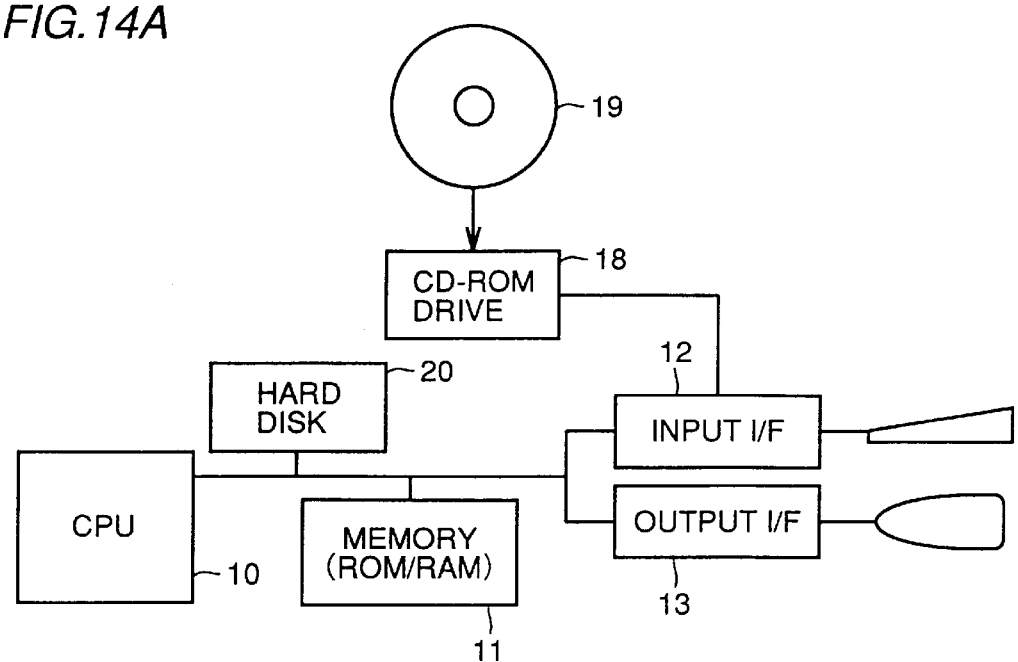
FIGS. 14A and 14B show an entire structure of a text compression apparatus according to a second embodiment of the present invention.
Figure 14B:
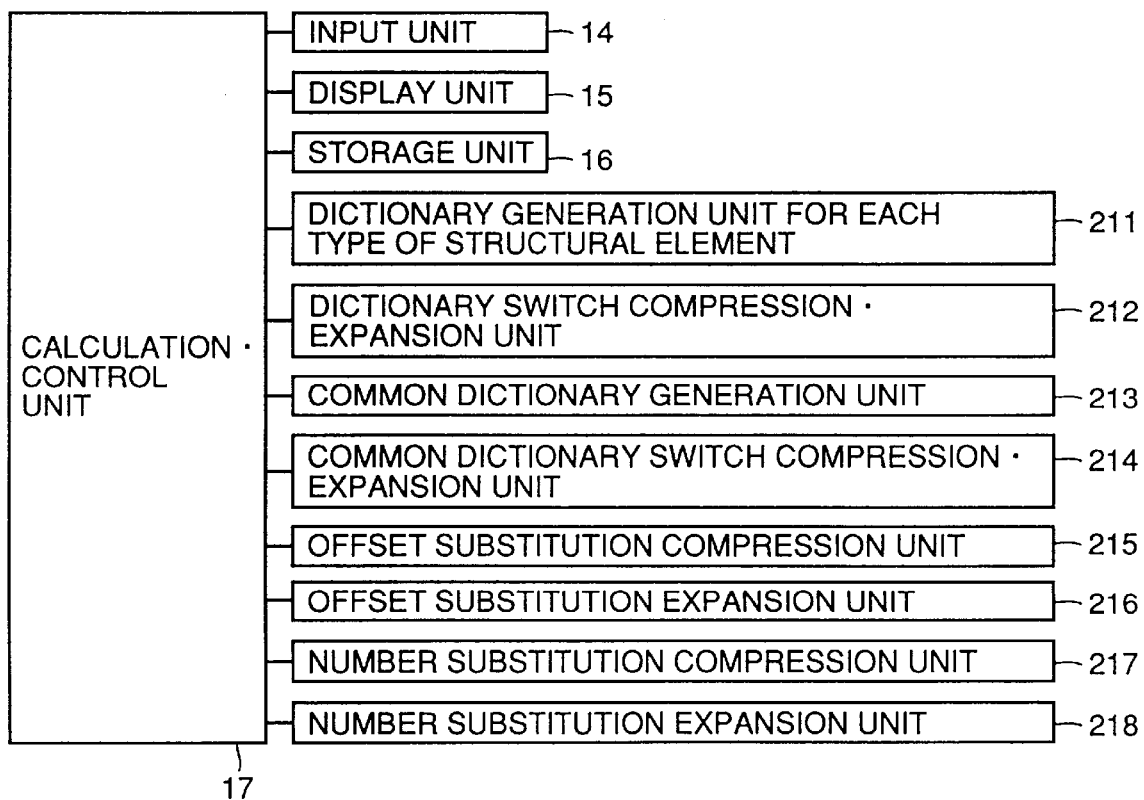

FIGS. 14A and 14B are diagrams for describing the entire structure of a text compression apparatus according to a second embodiment of the present invention. The basic structure is similar to the structure of the text compression dictionary generation apparatus of the first embodiment. Corresponding components have the same reference characters allotted, and description of the common structural elements will not be repeated. Only inherent components will be described.

A dictionary generation unit 211 for each structural element is a logic for generating a static dictionary, a code table, and a switch correspondence table for each structural element of source text with respect to input source text. This logic is stored in an area in the ROM of memory device 11 in a format that can be processed by CPU 10.

A dictionary switch compression•expansion unit 212 is a logic for compressing/expanding the source text while switching the code table for each structural element generated by dictionary generation unit 211 of each structural element. This logic is stored in an area in the ROM of memory device 11 in a format that can be processed by CPU 10.

A common dictionary generation unit 213 is a logic for grouping a text structural element common to each dictionary with respect to a plurality of dictionary text input for generating a static dictionary common to each dictionary and a code table for each structural element and a switch correspondence table for each dictionary. This logic is stored in an area of the ROM in memory device 11 in a format that can be processed by CPU 10.

A common dictionary switch compression•expansion unit 214 is a logic for compressing/expanding source text while switching the static dictionary for each structural element generated by common dictionary generation unit 213 according to a switch correspondence table prepared for each dictionary. This logic is stored in an area of the ROM in memory device 11 in a format that can be processed by CPU 10.

An offset substitution compression unit 215 is a logic for compressing dictionary source text by substituting a word of locally high frequency not registered in the static dictionary with an introduction symbol, occurrence position, and character string length. This logic is stored in an area of the ROM in memory device 11 in a format that can be processed by CPU 10.

An offset substitution expansion unit 216 is a logic for expanding the data compressed by offset substitution compression unit 215 to restore the same into the original source text. This logic is stored in an area of the ROM in memory device 11 in a format that can be processed by CPU 10.

A number substitution compression unit 217 is a logic for compressing dictionary source text by substituting a word of local high frequency not registered in the static dictionary with an introduction symbol and a number. This logic is stored in an area of the ROM of memory device 11 in a format that can be processed by CPU 10.

A number substitution expansion unit 218 is a logic for expanding the data compressed by number substitution compression unit 217 to restore the same into the original source text. This logic is stored in an area of the ROM of memory device 11 in a format that can be processed by CPU 10.

Similar to the first embodiment, dictionary generation unit 211 for each structural element type, dictionary switch compression-expansion unit 212, common dictionary generation unit 213, common dictionary switch compression•expansion unit 214, offset substitution compression unit 215, offset substitution expansion unit 216, number substitution compression unit 217, and number substitution expansion unit 218 can be supplied by CD-ROM 19.

A method for implementing each element inherent to the second embodiment will be described hereinafter.

Figure 15:
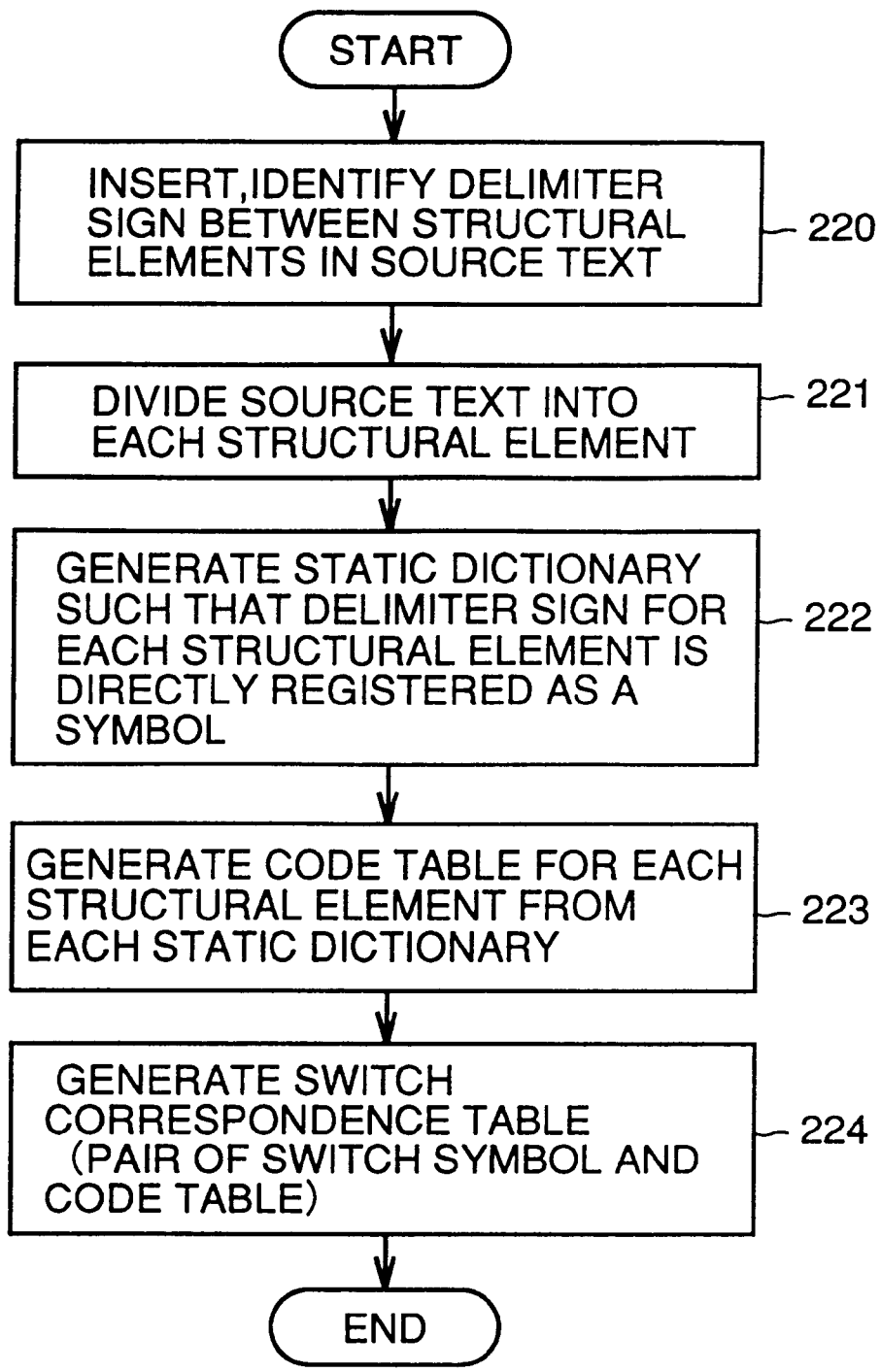
FIG. 15 is a diagram for describing a dictionary generation unit for each structural element type according to the second embodiment of the present invention.

Referring to FIG. 15, dictionary generation unit 211 for each structural element will be described hereinafter. The input of dictionary generation unit 211 for each structural element includes text constituted by a plurality of description portions. The description text of an English-Japanese dictionary (the portion other than the heading) is a typical example.

The output of dictionary generation unit 211 for each structural element includes a static dictionary and code table generated for each structural element, and a switch correspondence table (a pair of a switch symbol and a code table set immediately after occurrence of a switch symbol). In the present description, a switch symbol refers to a character string (symbol) for the delimitation of structural elements in the text, registered in the static dictionary.

When a character string that delimits the structural elements of the input text can be identified, the information of which structural elements are to be delimited are stored on the RAM with the identified character string as a delimiter sign. When a definite character string that delimits the structural elements cannot be identified, an appropriate character string that cannot possibly appear in the input text is inserted into the text as a delimiter sign. That delimiter sign and the delimited structural elements are stored on the RAM (220).

The source text delimited by a delimiter sign is divided so that the delimiter sign is included in the preceding structural element to generate a plurality of subtext (221).

An independent static dictionary of each divided subtext is cut out (a pair of a symbol of a variable length and frequency of occurrence thereof). The method of cutting out one static dictionary from the text is as described before. It is assumed to be a prerequisite method, and description thereof will not be repeated.

One procedure of the present method includes the steps of counting the number of occurrence of a character string having a length of i characters while shifting the head position one character at a time from the beginning to the end of the text, sorting the character strings according to the counted times of occurrence to cut out only the character string from the text of a frequency that contributes to the compression rate and registering this character string into the static dictionary, and carrying out this process on character strings having a length of (i−1) characters in the remaining text not cut out. This process is repeated up to I=N−1. Since it is necessary to always include a delimiter sign in the symbol registered in the static dictionary, first only the delimiter sign is cut out as a symbol of the static dictionary from the subtext of interest prior to cutting out a static dictionary. Then, by cutting out another symbol from the remaining subtext not cut out according to the above-described method, a static dictionary for each structural element is compiled (222).

Several methods are known for compressing and expanding text of interest using a static dictionary. In the present embodiment, the method of obtaining a code (a bit string of compressed data) assigned to each symbol is obtained from the static dictionary to generate a code table including pairs of a symbol and a code, and carrying out compression/expansion while referring to the code table will be taken as an example.

Any coding method can be employed in the present invention as long as it is based on statistics. A code table for each structural element is generated from each static dictionary according to a well-known method. This code table is stored in the ROM (223).

A delimiter sign is registered as a symbol in the static dictionary. This symbol of a delimiter sign is referred to as "switch symbol" hereinafter. According to the information of "a pair of a delimiter sign and structural elements delimited thereby" pre-stored in the RAM, a pair of a switch symbol and a code table of a structural element right after the switch symbol, i.e. a switch correspondence table, is generated and stored in the ROM (224).

The processing used in dictionary generation unit 211 for each structural element is shown in illustration process 225 et seq. with reference to FIGS. 16–21B. Illustrative process 225 shows a portion of the description text of an English-Japanese dictionary. The contents in the proximity of a heading "pace" is shown. From the beginning of each term (heading) of the text, the description portions of "pronunciation symbol ("[peis])")", translation ("[名],..., あるく")", example "at a, ..., 歩調で")", "inflected form ("[名][複数],..., pacing")" sequentially appear.

Since the characters of the pronunciation symbol and inflected form differ in the type of code from the other descriptions, compression can be carried out more efficiently by preparing separate static dictionaries thereof. Furthermore, the compression efficiency can further be improved by compressing the portion of the Japanese translation in the translation sentences and the examples as "Japanese text" and the English portion of the examples as "English text" since they differ greatly in the code type. Therefore, the text is divided, for example, into the structural elements of "Japanese", "English", "pronunciation symbol", and "inflected form".

FIG. 16B shows a delimiter sign inserted for delimiting the text of illustrative process 225 into respective structural elements of "Japanese", "English", "pronunciation symbol", and "inflected form".

As to a "pronunciation symbol", the text is switched to "Japanese" at the occurrence of "]". The example shows the case where there is a delimiter sign in the text from the beginning. As to "translation", all the text is processed as "Japanese", and the text is switched to "English" at the occurrence of a character string "●" inserted as a delimiter sign. As to an "example sentence", a character string representing the delimiter signs of "\" and "^" are respectively inserted at the portion switching to "Japanese" text and "inflected form" text in the example sentence.

FIG. 17 shows an example of the subtext where the text of illustrative process 226 is divided and grouped into each structural element of "Japanese", "English", "pronunciation symbol", and "inflected form". The text to be compressed is divided so that many of the same type of codes are included to generate a static dictionary for each text. FIG. 18 shows static dictionaries generated for each text of "Japanese", "English", "pronunciation symbol", and "inflected form" of illustrative process 228. In each static dictionary, the exact delimiter sign included in respective source text must be included as a "switch symbol". Symbol "]" for pronunciation symbols, symbols "●" and "^" for Japanese text, and symbol "\" for English text in respective static dictionaries are handled as switch symbols.

FIG. 20 shows an example of a "switch correspondence table" showing respective symbols and an appropriate code table to be subsequently used for compression/expansion.

FIG. 19 shows an example of a "code table for each structural element" generated by obtaining a code bit string according to a well-known method using the static dictionary for each structural element generated by illustrative process 228 of FIG. 18. In a code table according to statistics information, a short bit string is assigned to a symbol of high occurrence probability, and a long bit string is assigned to a symbol of low occurrence probability. For example, in the static dictionary for Japanese text, a short bit string is assigned to "(1)" and "●" of high frequency, and a long bit string is assigned to "ゆっくり" of low frequency.

Difference in compression efficiency between the case where a static dictionary is prepared after dividing the text for each structural element and the case where only one static dictionary is prepared with the entire text as the object in illustrative processes 22B and 22C in FIGS. 21A and 21B, respectively.

For example, symbol "[3⊬]-s" in the inflection static dictionary does not have a great difference in the frequency of occurrence between the case of the static dictionary just for inflected form text and the static dictionary for the entire text. However, the occurrence probability in the inflected form text is extremely greater than the occurrence probability of the entire text. Therefore, there is a great difference in the logical code length of "[3⊬]-s" obtained from the occurrence probability.

By appropriately dividing the text, the code length of each symbol can be shortened to reduce significantly the compression text data per se. However, the size of the static dictionary is increased since a plurality of static dictionaries (code tables) for each divided text must be prepared. In general, the compression rate is often improved in the case where the amount of text is huge (more than approximately 1M bytes since the compression rate of the text per se compensates for increase in the size of the static dictionary.

Figure 22:
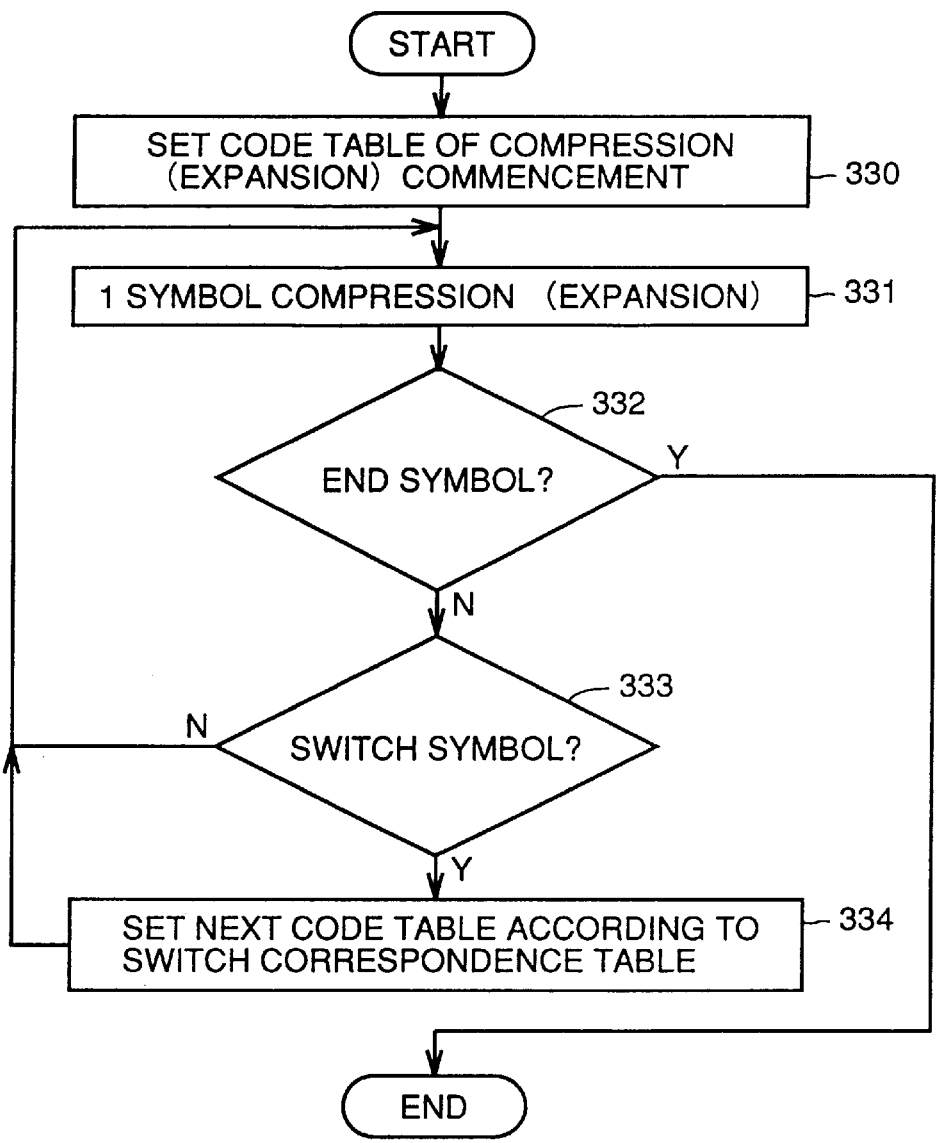
FIG. 22 is a diagram for describing a dictionary switch compressor-expander unit according to the second embodiment.

FIG. 22 is a flow chart of dictionary switch compression expansion unit 212. Input of dictionary switch compression expansion unit 212 includes source text (or compressed data) constituted by a plurality of structural elements definitely deliminated by a delimiter sign, a code table for each structural element generated by dictionary generation unit 211 for each structural element, and a switch correspondence table. The output of dictionary switch compression expansion unit 212 includes compressed data or a restored source text as a result of compression and expansion while switching the code table according to the code table and switch correspondence table.

The compression expansion method according to a code table will be described as to the procedure of "carrying out compression and expansion by switching the plurality of code tables" that is inherent to the present invention.

First, a code table set at commencement of compression (expansion) is determined (330). The code table set at the time of commencement differs depending upon what portion and from where compression is to be carried out. For example, when the beginning to the end of the description text corresponding to item "pace" in illustrative process 226 is to be compressed, a "code table of a pronunciation symbol" is set.

Then, compression (expansion) of 1 symbol is carried out according to the currently set code table (331). If the processed symbol is a symbol indicating termination of compression (expansion), the compression (expansion) is ended, otherwise detection is made whether that symbol is registered in the switch correspondence table as a switch symbol (332, 333). If that symbol is a switch symbol, the code table to be used in the next compression (expansion) is set according to the switch correspondence table. Then the program proceeds to the compression (expansion) of the next symbol. If the symbol is not a switch symbol, compression (expansion) of the next symbol is carried out using the currently set code table (334). When the switch symbol is a symbol that is inserted in the source text in the expansion process ("●" or "^" of illustrative process 226), the expansion result is not written into the expansion buffer, and the process is continued.

Figure 23:
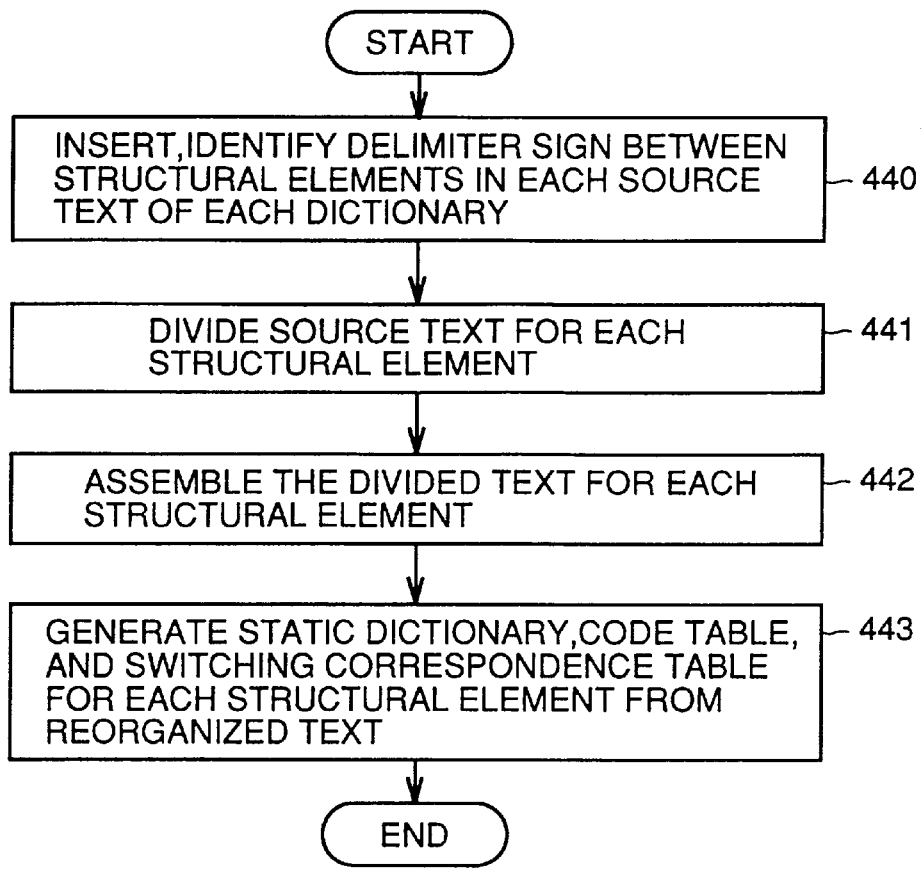
FIG. 23 is a diagram for describing a common dictionary generation unit according to the second embodiment.

FIG. 23 shows a flow chart of common dictionary generation unit 213. The basic process task of common dictionary generation unit 213 is similar to that of dictionary generation unit 211 for each structural element. When there is the same description portion in the plurality of dictionary text input, the compression efficiency is improved by assembling the text to be processed sharing the same description portion to prepare a static dictionary for each structural element than by preparing a static dictionary for each dictionary text. This concept is applied in the present invention. The process task is substantially identical to that of dictionary generation unit 211 for each structural element. The only difference is in the number of text which is the object of process. In dictionary generation unit 211 for each structural element, the processing of interest was only one text, whereas in common dictionary generation unit 213, the processing of interest is two or more different texts.

The input of common dictionary generation unit 213 includes a plurality of dictionary source text with at least one common structural element. The output of common dictionary generation unit 213 includes a static dictionary and a code table generated for each structural element, and a switch correspondence table generated for each dictionary (a pair of a switch symbol and a code table set right after occurrence of a switch symbol).

Identification and insertion of a delimiter sign are carried out for each source text of each dictionary according to a procedure identical to that of dictionary generation unit 211 for each structural element. The delimiter sign and structural elements delimited by the delimiter sign are stored on the RAM (440).

Then, the source text for each dictionary delimited by a delimiter sign is divided so that the delimiter sign is included in the preceding structural element to generate a plurality of subtext (441).

The divided subtext are assembled spanning over a plurality of dictionaries for each structural element (442). A static dictionary and a code table are generated from each recompiled text for each structural element according to a method similar to that of dictionary generation unit 211 for each structural element. The generated static dictionary and code table are stored in the ROM (443). In contrast to the case of dictionary generation unit 211 for each structural element, the "switch correspondence table" must be prepared for each dictionary taking into consideration the fact that a symbol in the same structural element is handled as a switch symbol in a dictionary including such a symbol and also handled as a simple symbol in another dictionary. The process of generating a switch correspondence table is similar to that of dictionary generation unit 211 for each structural element.

Examples of the processes described above are shown in FIGS. 24–28. A case will be described where four dictionary text of "English-Japanese dictionary", "Japanese-English dictionary", "English idiom dictionary" and "general dictionary" are input as the object to be compressed. Partial source text of "English-Japanese dictionary", "Japanese English dictionary", "English idiom dictionary" and "general dictionary" are shown in illustrative processes 444–447.

Each source text having a delimiter sign identified or inserted are shown in illustrative processes 448, 449, 44A and 44B. The delimiter signs in an "English-Japanese dictionary" includes "]" delimiting structural elements of a pronunciation symbol and Japanese text, "●" (insertion) delimiting Japanese text from English text, "\" (insertion) delimiting English text from Japanese text, and "^" (insertion) delimiting Japanese text from inflected form text. The delimiter signs in a "Japanese-English dictionary" includes "]" delimiting Japanese text from English text, and "\" delimiting English text from Japanese text.

The delimiter signs in an "English idiom dictionary" includes "\" delimiting English text from Japanese text. There is no delimiter sign in a "general dictionary", and it is assumed that the text is entirely formed of Japanese text.

Illustrative process 44C shows reorganized text by assembling the subtext of each dictionary divided for each structural element spanning over the dictionaries. Illustrative process 44D shows a static dictionary for each structural element cut out from the reorganized text for each structural element. Illustrative process 44E shows a switch correspondence table indicating a switch symbol and a code table set immediately after the switch symbol, generated for each dictionary.

From the standpoint of reducing the amount of compressed data in the source text of each dictionary, it is advantageous to build an individual static dictionary for each dictionary than generating a common dictionary since the occurrence probability of each symbol can be increased by some degree. However, in contrast to dictionary generation unit 211 for each structural element, it is more effective to suppress the amount of compressed data by sharing a static dictionary than increasing the occurrence probability of a symbol in the case where a plurality of dictionaries of great capacity are to be compressed. If a static dictionary for each structural element is generated for each dictionary, a considerable amount of symbols will be cut out in a duplicated manner to result in a redundant static dictionary.

For example, the Japanese text of ゆっくり and the English text of "at" both appear in different dictionaries even in a small range as shown in illustrative process 44C of FIG. 26. If they are defined with individual static dictionaries, many redundant static dictionaries having a plurality of the same symbols defined will be built.

Figure 29:
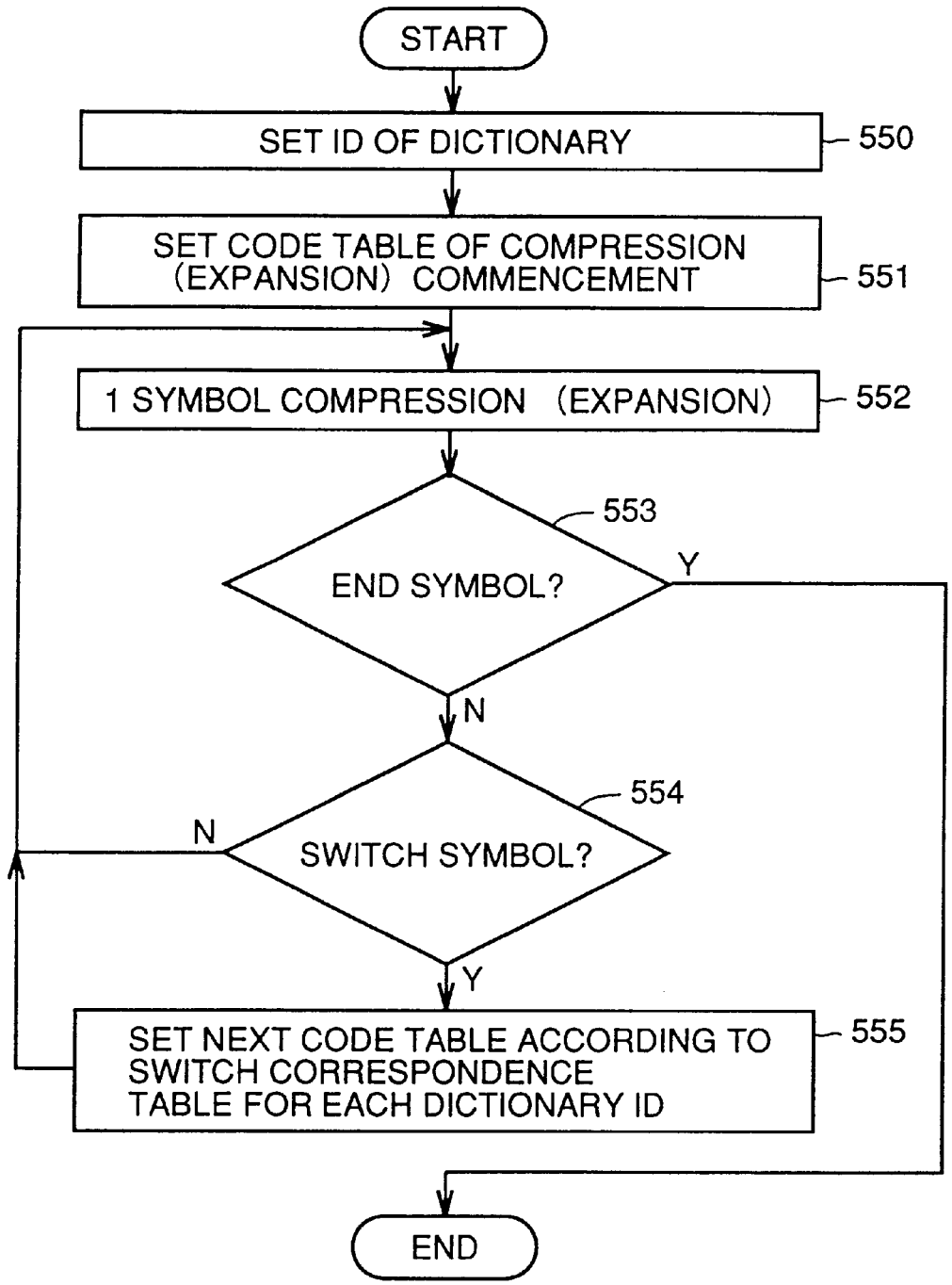
FIG. 29 is a diagram for describing the common dictionary switch compressor-expander unit according to the second embodiment.
Figure 30:
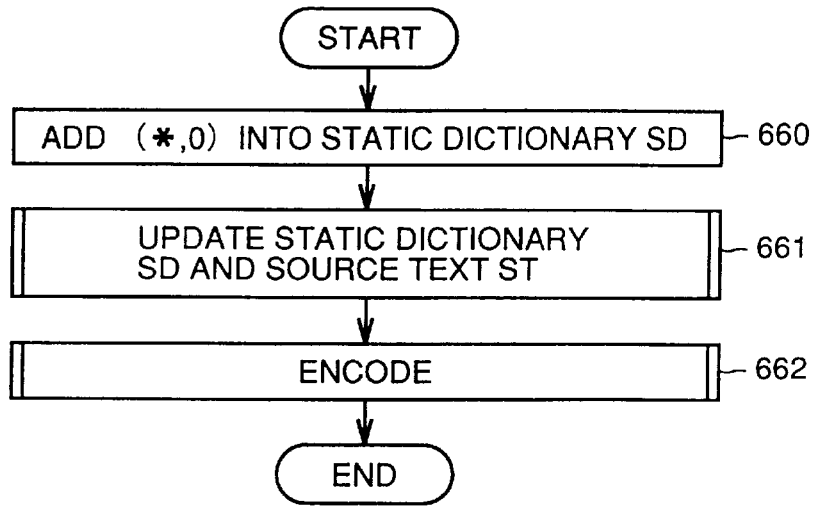
FIGS. 30–33 are diagrams for describing an offset substitution compression unit according to the second embodiment.
Figure 31:
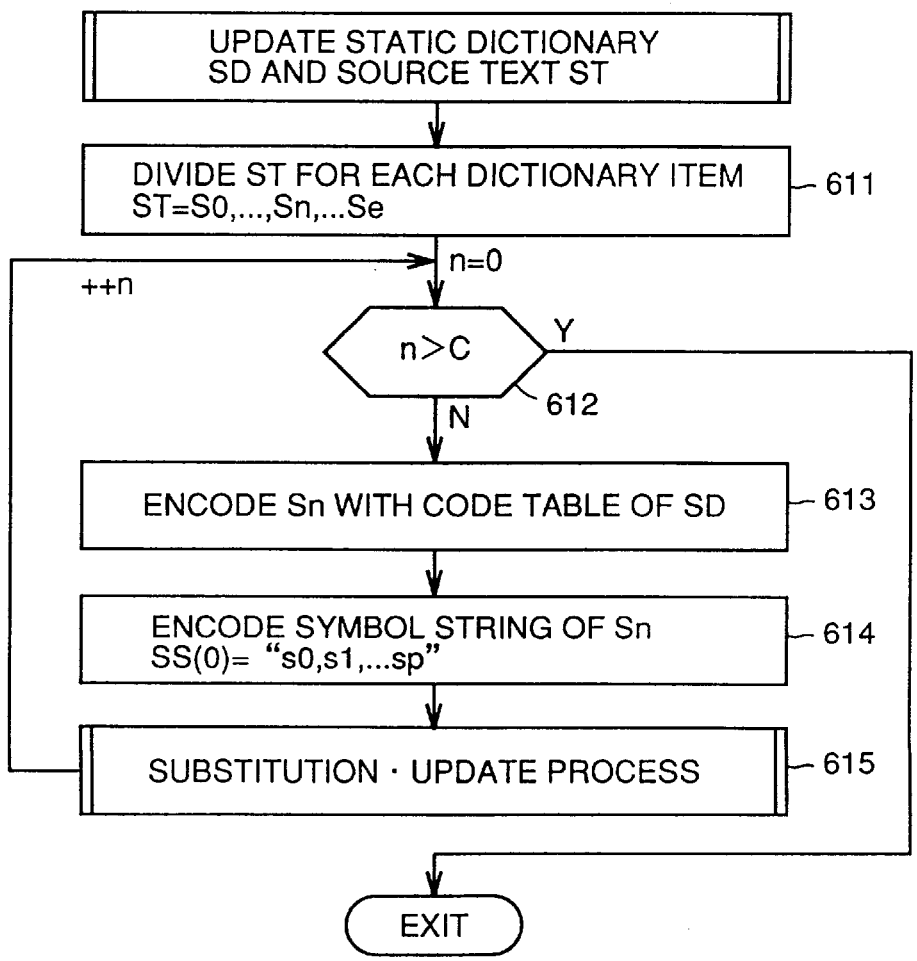

FIG. 29 is a flow chart of common dictionary switch compression-expansion unit 214. The input of common dictionary switch compression•expansion unit includes a plurality of dictionary source text (or compressed data) formed of structural elements definitely delimited by a delimiter sign, a code table for each structural element generated by dictionary generation unit 211 for each structural element, and a switch correspondence table generated for each dictionary. The output of dictionary switch compression•expansion unit 214 includes compressed data (or restored source text) which is a result of compression (expansion) while switching the code table according to the code table and the switch correspondence table.

A compression/expansion method using a code table is well-known for common dictionary switch compression•expansion unit 214, and description thereof will not be repeated. The procedure of "how the plurality of code tables are switched to proceed compression and expansion for each dictionary" which is inherent to the present invention will be described hereinafter.

First, a dictionary ID indicating which dictionary text is to be compressed (expanded) is set in the RAM. It is assumed that the ID is altered at each change of the dictionary text to be processed (550).

Then, the code table set at commencement of compression (expansion) is determined (551).

Next, a compression (expansion) process of one symbol is carried out according to the currently set code table (552). If the processed symbol is a symbol indicating the end of compression (expansion), the compression (expansion) process is ended, otherwise determination is made whether that symbol is registered as a switch symbol in the switch correspondence table corresponding to the dictionary ID (553, 554). If the symbol is a switch symbol, a code table to be used in the subsequent compression (expansion) process is set according to the switch correspondence table for the dictionary ID. Then the program proceeds to a compression/expansion process of the next symbol. If the symbol is not a switch symbol, a compression (expansion) process of the next symbol is carried out using the currently set code table (554, 555). In the case where the switch symbol is inserted in the source text (448) such as "●" and "^" in the expansion process, "●" and "^" in the expanded result are not written into the expansion buffer, and the process is continued.

Implementation of offset substitution compression unit 215 will be described hereinafter with reference to FIGS. 30–36.

The input of offset substitution compression unit 215 includes dictionary text that has a word of local high frequency, and a static dictionary code table pre-built with respect to that dictionary text. The output of offset substitution compression unit 215 includes compressed data of dictionary text that has the portion of the local high frequency word compressed to high efficiency. During the process, the word of high frequency is identified. Dictionary text substituted and amended according to the identified word of high frequency, and a static dictionary and code table updated with respect to the amended text are generated.

Description of the illustrative process will first be provided with reference to FIGS. 34A–36. Illustrative process 663 shows a portion of the source text of an English-Japanese dictionary. It is appreciated that respective descriptions of the heading items of "citric acid", "citron", "citrus" are described in order from the top.

Assuming that the words of local high frequency appearing in illustrative process 663 are "柑橘 (かんきつ) 類" and "シトロン", the text of illustrative process 663 is rewritten as illustrative process 664 by offset substitution compression unit 215. More specifically, the words of "柑橘 (かんきつ) 類" and "シトロン" are not substituted at the first occurrence, and substituted with 2 numerics delimited by the introduction symbols of "*" and ":" from the second occurrence onward. For example, "シトロン" in "シトロンの木 ... " at the second line of illustrative process 663 is substituted with "*29:, 8" in illustrative process 664, which represents that a character string occurs at this position identical to the character string of 8 bytes from a location 29 bytes ahead in the source text (="シトロン" of "シトロン (レモン) に ... " in the same line).

The introduction symbol may be any character as long as it is a character string not present in the input source text. The two numeric values representing the position of occurrence and the character string length must have their range limited taking account of the compression efficiency. In the present embodiment, the range is limited up to 1K bytes ahead (10 bits) for the position of occurrence and up to 32 bytes for the character string length.

Since the source text has been rewritten by the above-described substitution, corresponding modification must be made for static dictionary 665 and code table 666. More specifically, the integrity of the static dictionary and text is maintained by registering on introduction symbol "*" into the static dictionary (count up) and counting down each substituted symbol in the static dictionary for every one substitution. Following substitution of the entire text and modification of static dictionary 667, a code table is regenerated from the static dictionary according to the well-known method.

The updated text 664 is coded (compressed) according to the updated code table 668.

It is to be noted that the pair of numeric values right after "*" are not coded according to the code table. The process of converting the two numeric values into binary values of 10 bits and 5 bits differs from the normal case.

According to the above-described compression, the offset-substituted character string (the character string from the second occurrence onward) are all coded by the code length of the introduction symbol plus 15 bits. Although the code length depends upon the number of occurrences of the introduction symbol, the code length can be suppressed to be a short one for text in which a word of local high frequency often appears such as an English-Japanese dictionary.

Illustrative process 669 in FIG. 36 shows the comparison of the code length between the case where offset substitution compression is not employed and compression is effected according to the original static dictionary 665 and code table 666, and the case where compression is effected also using offset substitution compression.

It is appreciated that, when the symbol to be substituted is a word of local high frequency, a character string that has to be decomposed into several symbols of a long code length in the original static dictionary can be coded at the second occurrence and et seq. with a constant length of bits shorter than the former bit length by employing offset substitution.

The most important issue in using offset substitution compression is to skillfully detect the word of local high frequency. In other words, a character string for substitution must be found that that has the code length after substitution shortened than the case where the original static dictionary is compressed.

The code length of an arbitrary character string can be calculated from the original code table. Also, since the occurrence position and the character string length are constant, the code length after substitution can roughly be calculated before updating the static dictionary by appropriately estimating the code length of an introduction symbol. A character string for substitution is selected by constantly comparing these two values of the code length for an arbitrary character string. A character string that is expected to shorten the code length after substitution is to be selected.

A more detailed process procedure will be described hereinafter with reference to FIGS. 30–33. The process is mainly divided into two stages. In the first stage, an introduction symbol ("*", 0) is added (660). The text and static dictionary are updated while detecting a character string for substitution in the text during the first stage of process (661). At the second stage, the updated text is encoded according to the code table generated from the updated static dictionary (662).

As preparation of the task to update the original static dictionary SD and source text ST, ST is divided by each item in the dictionary (S0, . . . Se) as the unit of process (611) taking into consideration access of compressed data for each item. Text Sn for each item is sequentially processed from n=0 to e (612). First, Sn is encoded using a code table of the original SD not updated (613). The encode symbol string SS(0)="s0, s1, . . . , sp" of the encode symbol string of Sn is extracted (614). (S0, . . . Se) An encode symbol refers to a symbol in the static dictionary (code table) that is the interest of coding in the actual encode step. For example, the correspondence text of "citron" of illustrative process 663 in FIG. 34A becomes s0="[名](1)", s1="シ", S2="ト", S3="ロン", S4="(", . . . , sp=")".

Figure 32:
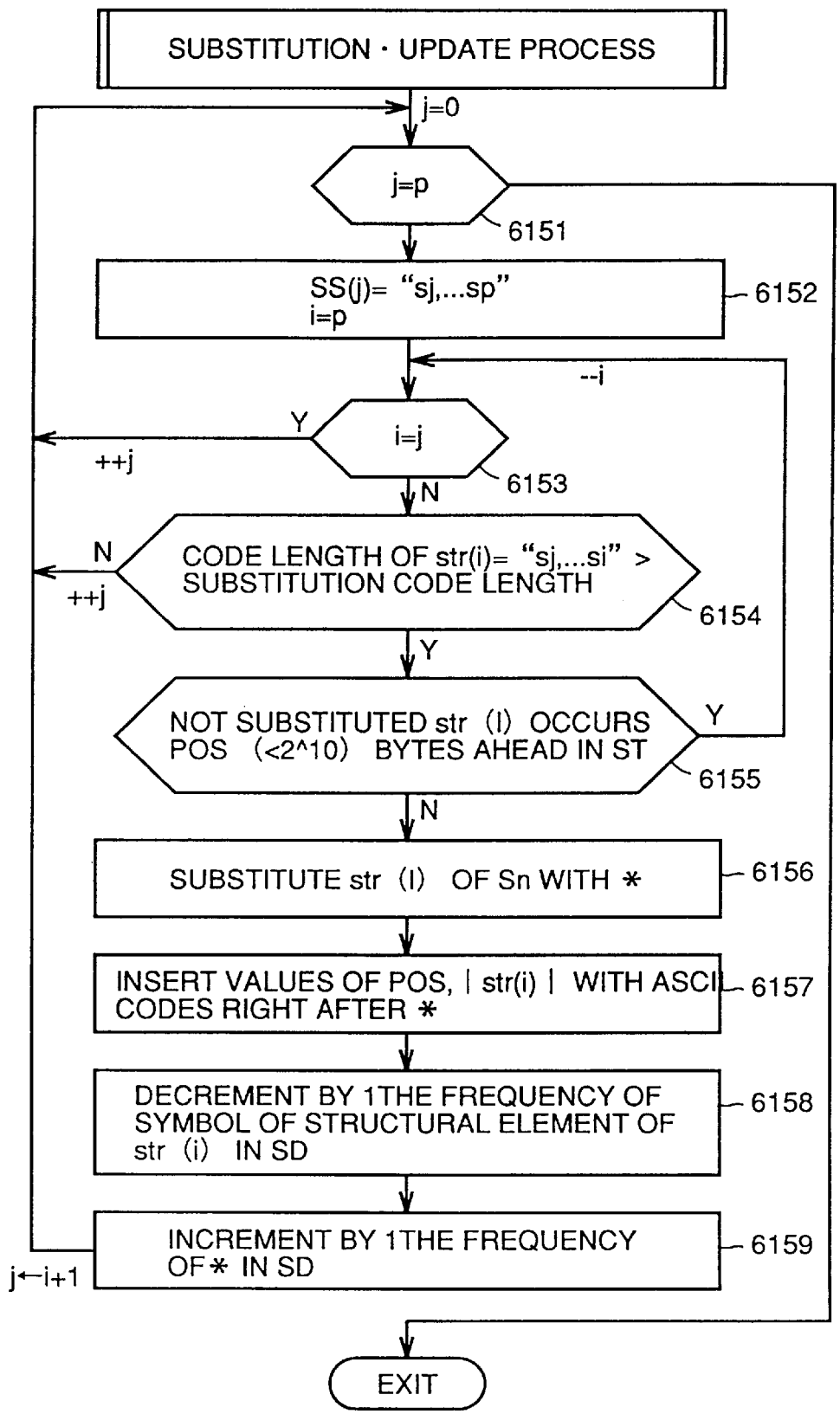

The substitution•update process (615) of SS(0) is set forth in FIG. 32. SS (j) indicates the current range to be processed. As the process proceeds, the value of j is increased, and the range for process is reduced 1 encode symbol at a time in the backward direction. At the end of the process of SS(p-1), the substitution•update process for the dictionary first term (SS(0)) is completed (6151).

Detection is made whether a character string str(i) which is a word of local high frequency is present in SS(j). If there is such a character string, the identified str(i) is updated and the static dictionary is amended. According to the present assumption, i=p is set (6152), and detection is made whether a word of local high frequency is present in SS(j) sequentially from the longest character string. When a word of high frequency is found, the position of j is updated to i+1, and the process is carried out on the remaining process range SS(j). When no character string is found even when i=j+2, i.e. even when str(i) is reduced to the first two symbols of SS(j), the range of process is shortened by 1 symbol, and the process is continued for SS(j+1)(6153).

Taking the text corresponding to "citron" of illustrative process 663 as an example, str(13)='シ' 'ト' 'ロン' for SS(11)='シ' 'ト' 'ロン' 'の' '本', . . . , 'ケーキ' '用'. The same character string occurs 29 bytes ahead in the original ST (the first occurrence of "シトロン"). This word is processed as the word of local high frequency.

Detection of whether str(i) is a word of local high frequency is carried out as follows. To eliminate extra process, the code length of str(i) is calculated from the code table. If this code length is not shorter than the substitution code length, the compression efficiency will not be improved even if there is a matching character string ahead. Therefore, the substitution•update process is not carried out, and the range for process is advanced (6154). Although the substitution code length is set to 22 bits in the illustrative process (estimated introduction character string length 7 bits, occurrence location 10 bits, character string length 5 bits), the optimum values depend upon the text.

When the code length of str(i) is shorter than the substitution code length, it is taken as a candidate of the word of local high frequency. A search is made whether there is a character string identical to str(i) for the character string ahead by the limited width of the occurrence position (in the present embodiment, 1024 bits) from the current position on the original SD not updated. When the same character string is found at a location (pos(<1024) bits ahead on the original source text, and when that character string is not yet substituted in the updated text (6155), str(i) is substituted with "*" (6156). Immediately thereafter, the values of POS and str(i) are delimited by ",", and output in ASCII codes (6157). Corresponding to amendment of the text, symbols sj, . . . , si in str(i) are deleted from the text one by one. Therefore, each frequency of sj, . . . , si in static dictionary SD is decremented by 1 (6158), and the frequency of "*" in SD is incremented by 1 (6159) since one "*" is sequentially increased.

The text corresponding to "citron" of illustrative process 663 is taken as an example again. When detection is made with str(4)='シ' 'ト' 'ロン' 'の' of the third occurrence as the candidate of local high frequency, the same character string occurs 31 bytes ahead in the original ST (second "シトロン" and et seq.). However, this is already substituted in the updated text by a prior process. This does not satisfy the latter portion of the condition of "the case where the same character string is found, and that character string is not yet substituted in the updated text", this word will not be processed as a word of local high frequency. str is decremented by 1 more symbol, and str(3)= 'シ' 'ト' 'ロン' matching the first occurrence (not substituted) of "シトロン" is then substituted as a word of local high frequency.

When the same character string is not found in the limited width, the character string for detection is reduced by one symbol from the tail portion (—i), and the process for str(i-1) is carried out.

Figure 33:
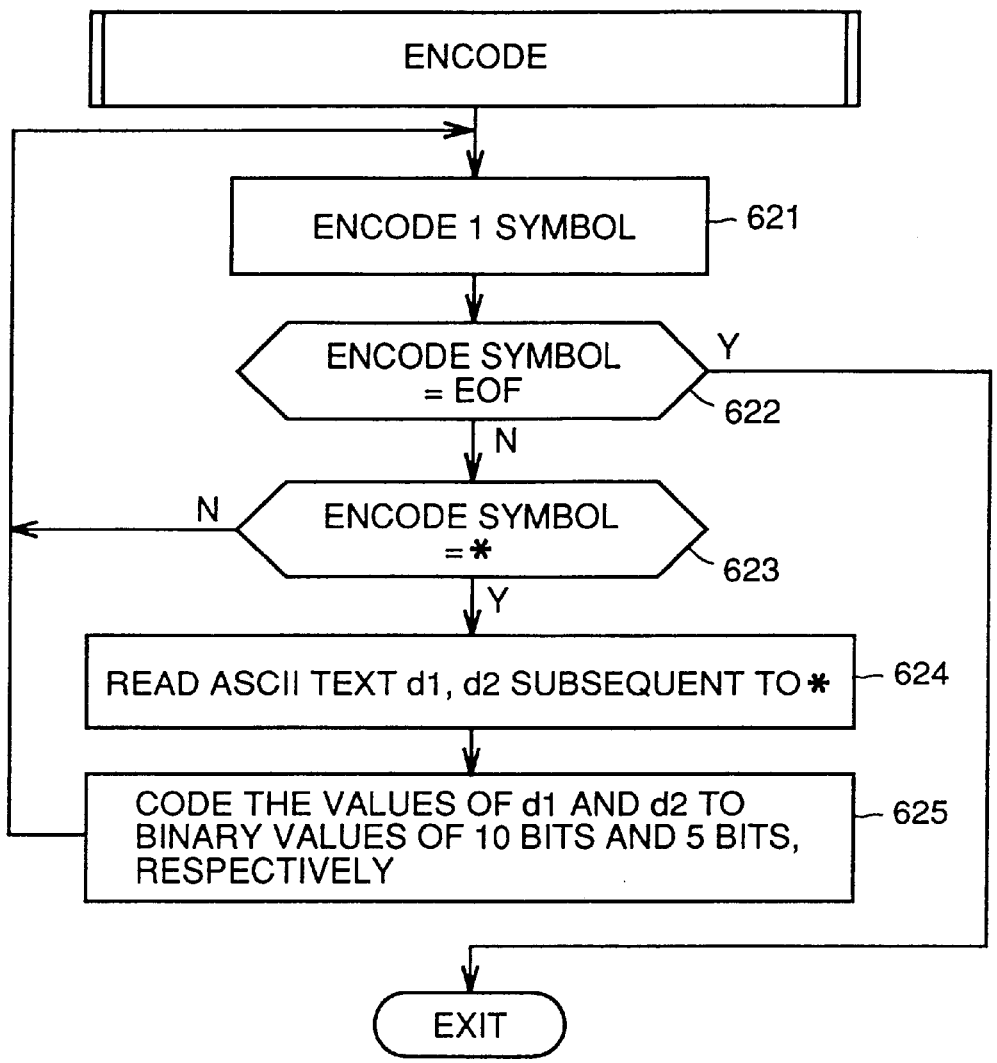

Next, a method of encoding the updated source text with the updated static dictionary will be described with reference to FIG. 33. Compression is carried out using the well-known method of generating a code table from the static dictionary, and substituting the character string with a bit string while referring to the code table. However, the portion corresponding to offset substitution must be carried out by an individual process.

Encoding is carried out by the well-known method (621) one symbol at a time until the occurrence of the end symbol (622). However, when the encode symbol is the introduction symbol "*" (623), the succeeding ASCII numerics d1 and d2 delimited by "," are read in (624). Each value of d1 and d2 is binary-packed by the determined bit widths of the occurrence location and the character string length (10 bits and 5 bits, respectively, in the present embodiment)(625).

Figure 37:
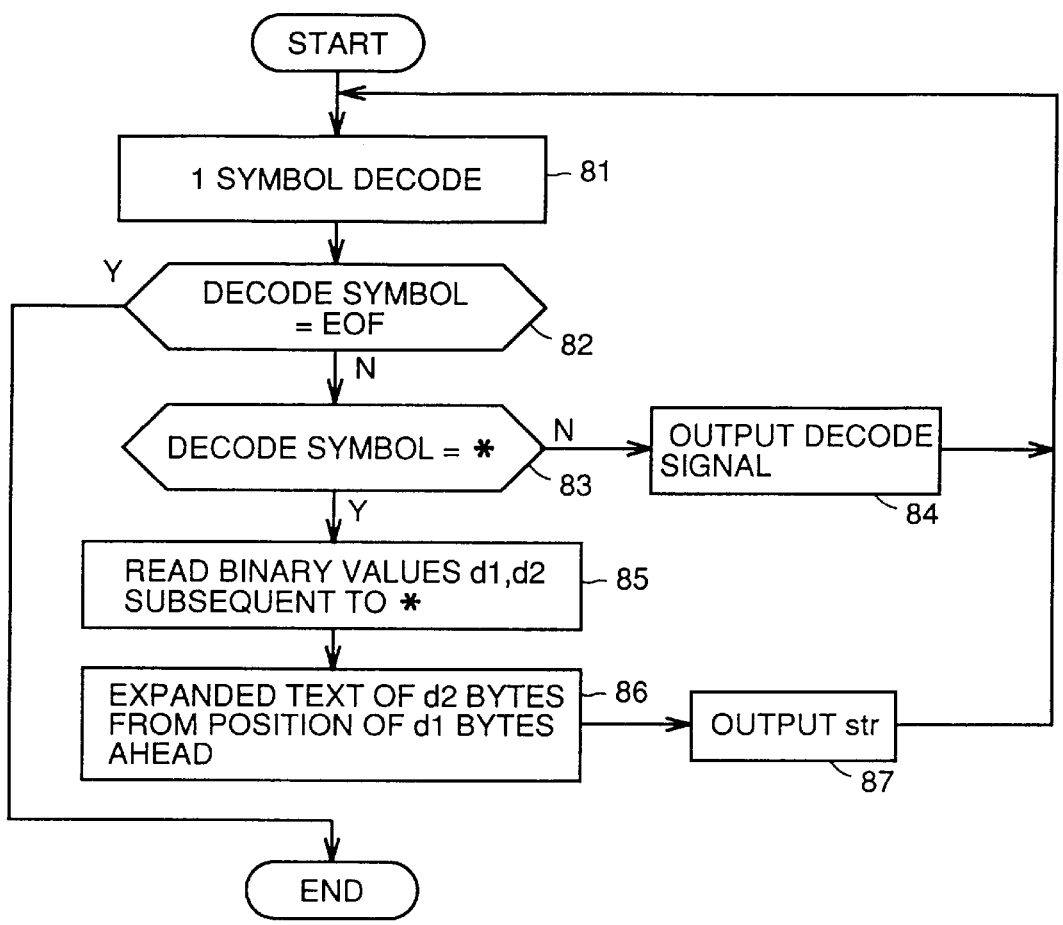
FIG. 37 is a diagram for describing an offset substitution expansion unit according to the second embodiment.

Referring to FIG. 37, implementation of offset substitution expansion unit 216 for expanding data compressed by offset substitution compression unit 215 will be described. Similar to the above-described encode process, the offset substitution expansion process is basically carried out using the well-known method. Only the modified portion depending upon offset substitution compression differs in the offset substitution expansion process.

For the sake of simplifying the description, it is assumed that expansion is carried out from the beginning of the compressed data in the flow chart. The compressed data is expanded 1 symbol at a time by a well-known method according to the code table (81) until the expanded symbol arrives at the end code (82).

When the decode symbol is not "*" the decoded character string is output (84), and the next data is decoded. If the decode symbol is "*", the next compressed data of 15 bits is read in. Occurrence position d1 and character string length d2 are set. A character string of d2 bytes from the position of d1 bytes ahead from the current position is output as the expanded result of the substitution code from the already restored text (86, 87). Then, the program proceeds to the process of the next compressed data.

According to the above-described expansion algorithm, expansion must be carried out basically from the beginning of the compressed data even in the case where only a particular item in the dictionary is to be expanded. However, in practice, only the information of 1024 bytes ahead from the item of expansion (on the source text) needs to be processed in advance according to the limitation in compression. In other words, when only a particular dictionary item is to be expanded, expansion commences from the compressed data delimiter corresponding to an item at least 1024 bytes ahead of a predetermined dictionary item on the source text.

Since the substitution-compressed portion cannot be restored to the original text unless the preceding data is expanded during the expansion process of the portion, only information of how many bytes of a character string it is on the restored text can be obtained. Specifically, this is obtained from the information of the character string length of the substitution code without conducting any restore operation back to text. All the other portions that can be restored back into text are decoded.

By this preparation, calculation of how many bytes ahead from the current position the arbitrary character string located in the range of at least 1024 bytes and restored into text occurs can be provided. Since the character string for substitution will never be substituted otherwise according to the method realized by offset substitution compression unit 215 (the process requirement of 6155 in FIG. 32), a restored text of the character string length will certainly be present at the position scrolling up to the occurrence position.

Although an expansion process starting from an arbitrary item in the dictionary requires processing of slightly complicated logic and some overhead in the processing time, offset substitution expansion unit 216 provides an advantage of not degrading the retrieval performance of the dictionary module since the dictionary source text does not have to be expanded starting from the beginning of the compressed data.

Figure 38A:
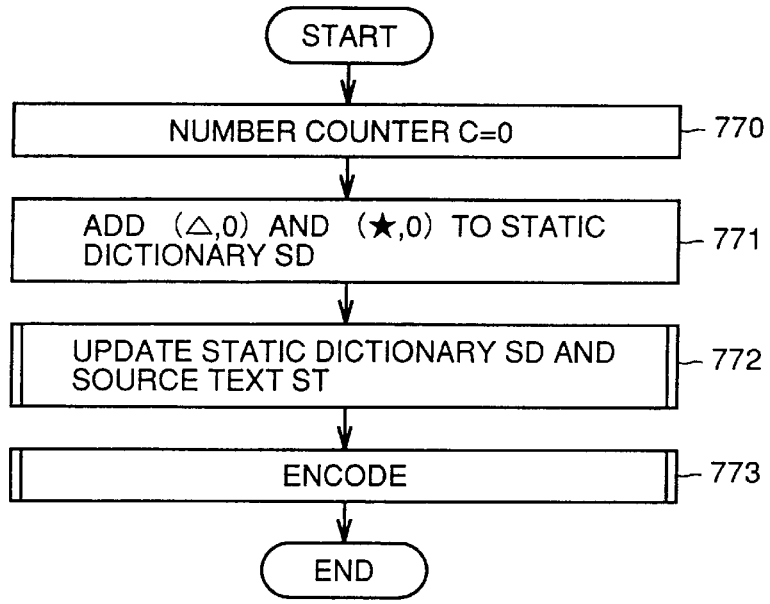
FIGS. 38A, 38B, 39, and 40 are diagrams for describing a number substitution compression unit according to the second embodiment.
Figure 38B:
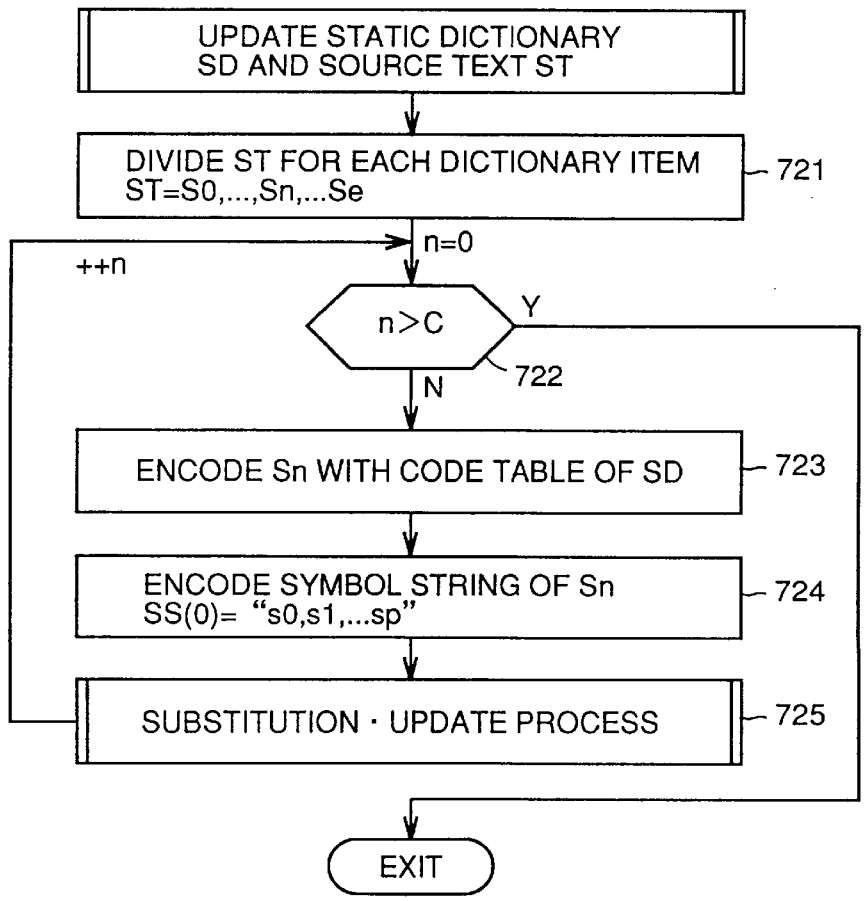
Figure 39:
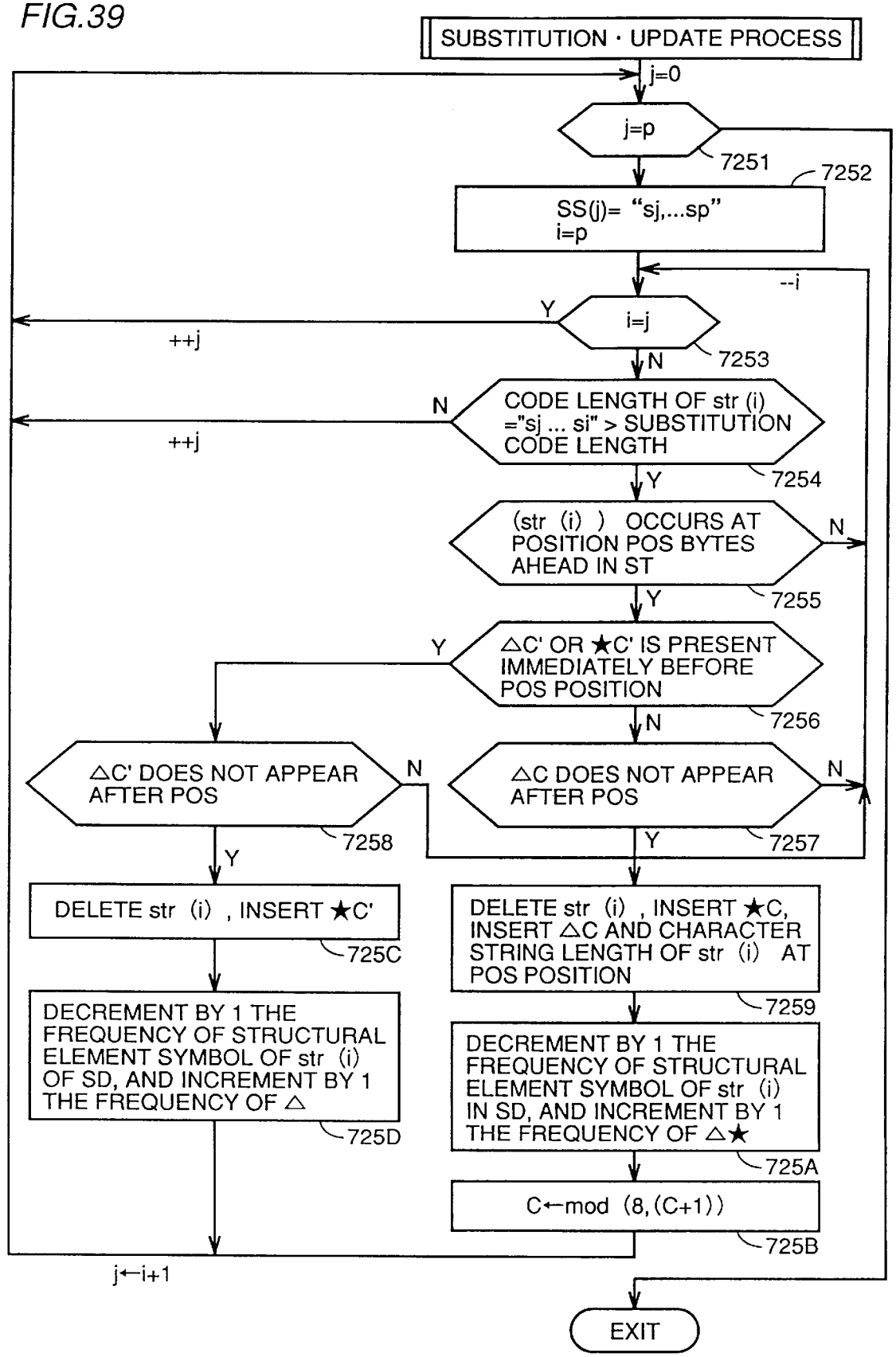
Figure 40:
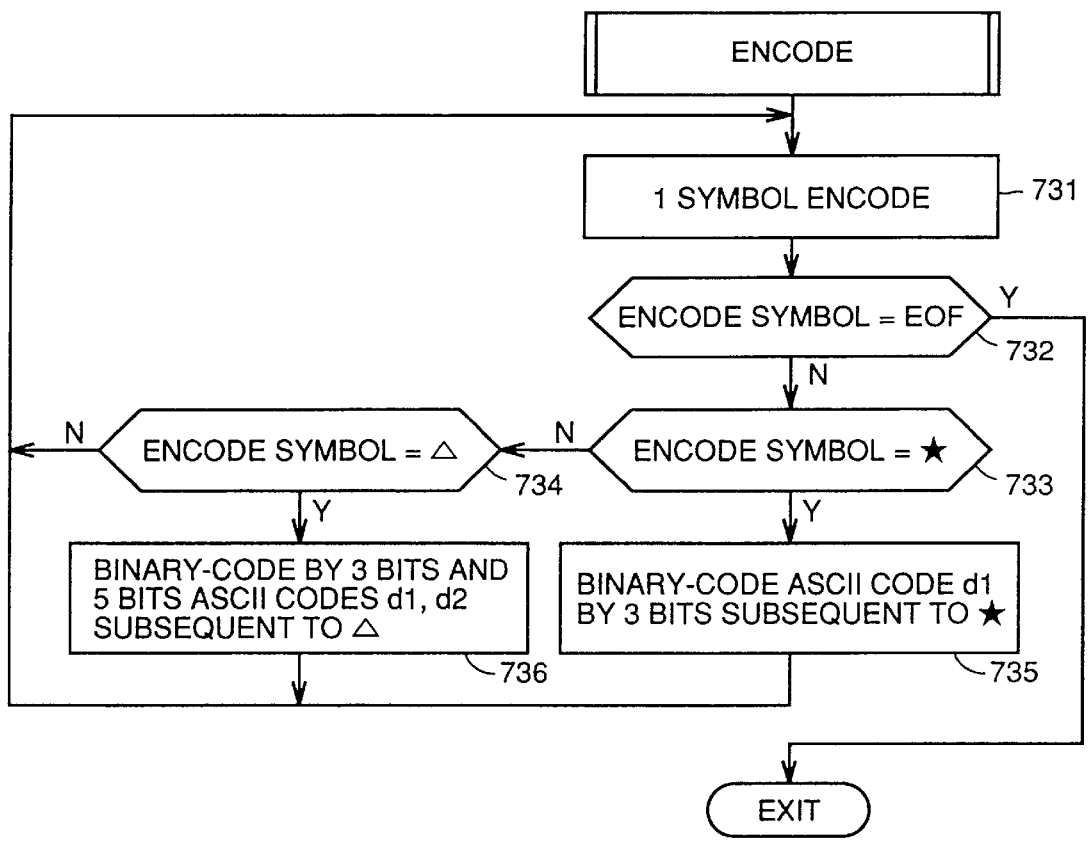

Referring to FIGS. 38–40, implementation of number substitution compression unit 217 will be described.

Input of number substitution compression unit 217 includes dictionary text in which a word of local high frequency is present, and a static dictionary and code table built in advance with respect to that dictionary text, similar to those of offset substitution compression unit 215. The output of number substitution compression unit 217 includes compressed data of the dictionary text having the portion of the word of local high frequency compressed at high efficiency. Also, a dictionary text substituted and modified with an identified word of high frequency, and a static dictionary and code table updated with respect to the amended text are generated during the process.

For the sake of convenience, illustrative processs will first be described with reference to FIGS. 40–43.

Illustrative process 774 is a portion of the source text of an English-Japanese dictionary identical to illustrative process 663 corresponding to offset substitution compression unit 215. Assuming that the words of local high frequency appearing in illustrative process 774 are "柑橘 (かんきつ) 類" and "シトロン" the text of illustrative process 774 is rewritten as illustrative process 775 by number substitution compression unit 217. More specifically, the words of "柑橘 (かんきつ) 類" and "シトロン" at the first occurrence have an introduction symbol Δ, a number, and a numeric value representing the character string length inserted before the word, and then substituted, at the second occurrence and et seq., with an introduction symbol ★ and the number identical to that assigned at the first occurrence.

For example, Δ1, 8 is inserted in illustrative process 775 before "シトロン" of "(1)トロンの木( . . . " at the first occurrence in the second line of illustrative process 774. This represents that the following 8 bytes are registered as the character string to be substituted with number 1. The next "シトロン" of ""シトロンの木 . . . " on the same line is substituted with ★1. This represents that the character string with the closest Δ1 as its prefix is substituted with *1.

Similar to offset substitution compression unit 215, the introduction symbol may be any character string as long as it is not present in the input source text. The numeric values indicating the number and character string length must have their range limited taking into consideration the compression efficiency. In the present embodiment, the number is limited to 8 numbers of 0–7 (3 bits), and the character string length is limited up to 32 bytes (5 bits).

It is to be noted that not only 8 numbers can be used for the entire text. The usage of the numbers is unlimited by mod-8 (return to 0 after 7), provided that the text is substituted under the proviso that ★d indicates a character string of 1 byte subsequent to the closest Δd, 1 ahead to carry out expansion in a one-to-one correspondence.

Modification of static dictionary 776 and code table 777 corresponding to the text substitution operation is similar to that of offset substitution compression unit 215. More specifically, in the first substitution, "Δ" and "★" are counted up and each substituted symbol in the static dictionary is counted down. In the second substitution onward, "★" is counted up and each substituted symbol is counted down in the static dictionary. Following substitution of the entire text and modification of static dictionary 778, code table 779 is regenerated according to the well-known method from the static dictionary.

Illustrative process 775 of the updated text is coded (compressed) according to the updated code table 779. The process right after "Δ" and the process right after "★" differ from the normal case. More specifically, coding using a code table is not carried out for the pair of numeric values right after Δ. The numeric value pair is converted into binary values of 3 bits and 5 bits. For the numeric value right after ★, coding using to a code table is not carried out. The value is converted into a binary value of 3 bits.

By the above compression, all character strings substituted with a number (the character string at the second occurrence and et seq.) are coded by the code length of the introduction symbol plus 3 bits. Although the code length thereof depends upon the number of occurrences of the introduction symbol, the code length thereof can be set shorter for text having a word of local high frequency such as in an English-Japanese dictionary.

When there are many occurrences of the same character string for substitution, the present method is advantageous from the standpoint of compression efficiency since the code length for the substitution character string is shorter than that of offset substitution compression unit 215. Illustrative process 77A shows the comparison of the code length between the case where number substitution compression is not employed and compression is carried out using original static dictionary 776 and code table 777, and the case where compression is carried out together with number substitution compression.

The most important issue in using the number substitution compression is to skillfully detect a word of local high frequency as in the case of offset substitution compression unit 215. A character string for substitution must be found that has the code length after substitution reduced than the case where compression is carried out with the original static dictionary. In number substitution compression, the code length calculated from the original code table is compared with the code length after substitution. A character string expected to have a shorter code length after substitution is to be selected.

The above number substitution compression method will now be described in further detail with reference to FIGS. 38–40.

Similar to offset substitution compression unit 215, the process is mainly divided into two stages. At the first stage, number counter C is cleared to 0 (770). Introduction symbols ("Δ",0) and ("★",0) are added into the original static dictionary SD(771). The text and static dictionary are updated while detecting a character string for substitution in the text during the first stage of process (772). At the second stage, the updated text is encoded according to a code table generated from the updated static dictionary (773).

As preparation of the task to update original static dictionary SD and source text ST, ST is divided into each item heading of the dictionary (S0, Se) as the process unit taking into consideration access of compressed data of each item (721). Text Sn for each item is sequentially processed from n=0 to e (722). Sn is encoded with a code table of original SD that is not updated (723) to extract the encode symbol string SS(0)="s0, s1, . . . , sp" of Sn (724).

Substitution-update process 725 for SS(0) is shown in FIG. 39. SS(j) indicates the current range for processing. As the process proceeds, the value of j is increased, and the range to be processed is reduced by 1 encode symbol at a time in the backward direction. At the end of the process of SS(p−1), the substitution•update process for the first item (SS(0)) is terminated (7251).

Detection is made whether there is a character string str(i) which is a word of local high frequency in SS(j) for the processing range of SS(j)="sj, . . . , Si, . . . , Sp". If there is such a character string, the identified str(i) is updated, and the static dictionary is amended. In this procedure, i=p is set (7252). Detection is made whether there is a word of local high frequency sequentially from the longest character string in SS(j). If such a word is found, the position of j is updated to i+1, and the process is carried out for the remaining processing range SS(j). When a word of local high frequency is not found even when i=j+1, i.e. str(i) is reduced up to the first 2 symbols of SS(j), the processing range is shrunk by 1 symbol to carry out the process for SS(j+1).

The process up to this procedure is similar to that of offset substitution compression unit 215.

Detection of whether str(i) is a word of local high frequency is made as follows. First, to eliminate extra processing, the code length of str(i) is calculated from the code table. If the calculated code length is not shorter than the substitution code length, the compression efficiency cannot be improved even if there is a matching character string before. In this case, the substitution-compression update process is not carried out, and the process of range SS(j) is advanced (7254). Although the substitution code length is set to 26 bits in the illustrative process (assumed introduction character string length (77+8) bits, number (3*2) bits, character string length 5 bits), the optimum values differ depending upon the text.

When the code length of str(i) is shorter than the substitution code length, that character string is assumed to be a candidate of a word of local high frequency. A search is made to identify if there is a character string identical to str(i) in the character string of an appropriate range ahead from the current position on the original SD not updated. When the same character string is found on the original source text at a position POS bytes ahead, the substitution process proceeds to the next step (7256). If the same character string is not found, a search is carried out again for str(i−1) which is str(i) shortened by 1 encode symbol (7255).

When a character string identical to str(i) is found POS bytes ahead on the original source text at process 7255, the program proceeds to steps 7256 and 7257 to make sure that neither ΔC', 1 nor ★C' is arranged immediately preceding the position corresponding to the POS position in the updated text (i.e. it is a character string not yet substituted), and that there is no ΔC after the position corresponding to the POS position in the updated text. Since it is definite that the character string to which a number is to be assigned is located closest ahead from the position of the character string for substitution, ΔC, 1(1=|str(i)|) is inserted right before the POS position. A character string of 1 byte succeeding the POS position is registered as number C, and str(i) is substituted with ★C (7259).

Detection of presence of ΔC means that a search has been carried out retroacting to a portion preceding the portion assigned with number C. If the number of C is assigned here, it can no longer be identified which ΔC the following ★C corresponds to. In other words, it is not definite whether the current character string to which a number is to be assigned is located closest ahead from the position of the character string for substitution. In such a case, the process for str(i) is inhibited, and a process for str(i−1) is carried out (7257).

Following amendment of the text at process 7259, the static dictionary is correspondingly amended (725A). Since number C has been registered, the number counter is advanced by mod(8, (C+1)) (725B). The processing range j is updated to i+1. The process for the portion not yet processed is continued.

When ΔC', 1 or ★C' is arranged immediately before the position in the updated text corresponding to the POS position at steps 7256 (i.e. there is a character string that is already substituted or that has the number registered), confirmation is made that no ΔC' appears after the position corresponding to the POS position (7258). Character string str(i) is substituted with ★C' (725C). The corresponding portion in the static dictionary S" is amended (725D).

Since the character string that is substituted in the current process is a character string previously assigned with number C', C is not updated and only the processing range is shifted by i+1. The process is carried out for the remaining portion of SS(i+1).

The above process is further described taking the text substituted with "citron of illustrative process 774 of FIG. 41A as an example.

It is now assumed to be C=1 and the process has proceeded up to the second occurrence of str(13)= ' シ ' ' ト ' ' in SS(11). In process 7255, an identical character string ahead by POS=29 bytes is identified. Upon satisfying the requirements of processes 7256 and 7257, the program proceeds to process 7259. At this timing, Δ1, 8 is disposed before the first "シトロン", and the second occurrence of "シトロン" (=str(13)) is substituted with ★1. The static dictionary is updated. With C=2, the processing range moves to "の木(3) . . . " onward. When the third occurrence of "シトロン" is set at str still at C=2, the identical character string is identified at the position of POS=31 bytes ahead by process 7255. However, since this character string is substituted with ★1 already in the updated text (corresponding to Yes at process 7256), the character string is substituted with ★1 of the third occurrence of "シトロン".

Referring to FIG. 40, a method of encoding the updated source text with the updated static dictionary will be described. Compression is carried out by the well-known method of generating a code table from the static dictionary and substituting the character string with a bit string while referring to the code table. The portion corresponding to number substitution must be carried out by an individual process.

The source text is encoded by the well-known method (731) 1 symbol at a time until the end symbol appears (732). However, when the encode symbol is an introduction symbol "★" (733), the subsequent ASCII number d1 is read in, which is binary-packed by 3 bits. The process proceeds to encode the next portion (735). When the encode symbol is "Δ", not "★", the subsequent ASCII numeric values of d1 and d2 are binary-packed by 3 bits and 5 bits, respectively. The process proceeds to encode the next portion (736).

Figure 44:
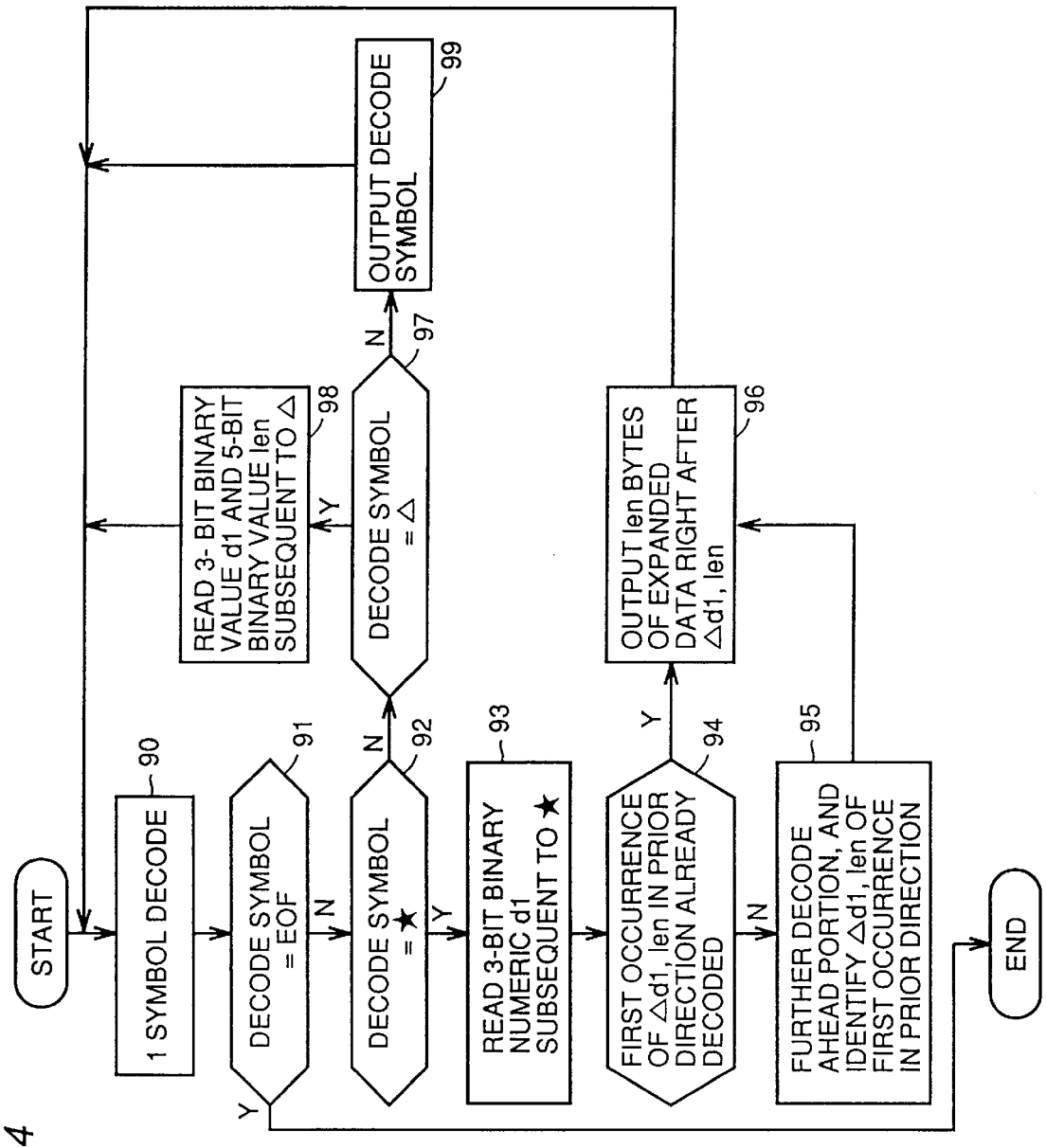
FIG. 44 is a diagram for describing a number substitution expansion unit according to the second embodiment.

Referring to FIG. 44, expansion of data compressed by number substitution compression unit 217 will be described. Number substitution expansion unit 218 basically employs the well-known method similar to the encode process. Only the portion modified corresponding to number substitution compression differs in the number substitution expansion process.

The compressed data is expanded 1 symbol at a time by the well-known method according to the code table (90) until the expanded symbol becomes the end code (91).

When the decode symbol is neither "★" nor "Δ", the character string of the decoded result is output (99) to proceed to expansion of the next data. When the decode symbol is "Δ", the next 8 bits of compressed data are skipped to proceed to the subsequent expansion of the subsequent data.

If the decode symbol is "★", the next 3 bits of compressed data are read in to obtain number d1 (93). If len bytes subsequent to "Δd1,len" of the first occurrence in the preceding direction in the previous process are already expanded (94), the character string of that len bytes is output as the decoded result (96) to proceed to expansion of the next data.

If the len bytes succeeding "Δd1,len" are not yet expanded, the further preceding portion is decoded to define the position of the first occurrence of "Δd1,len" in the preceding direction from the current position and the character string of len bytes thereafter (95). Then, the character string of len bytes is output as the decoded result (96). The program proceeds to expansion of the next data.

According to the above expansion algorithm, expansion must be retroactively carried out at each occurrence of substitution data (★d) if the corresponding Δ is not yet expanded. However, a particular dictionary item can be expanded basically. Therefore, number substitution expansion unit 218 has the advantage of not degrading the retrieval performance of the dictionary module.

According to the text compression apparatus of the second embodiment, a specific method of compressing/expanding dictionary text data efficiently is provided for an apparatus such as an electronic dictionary that requires dictionary text data of a great amount. Particularly in the case where the dictionary text of interest is formed of a plurality of different description portions (such as an English-Japanese dictionary), and when a plurality of dictionary texts including a common structural element are to be compressed (English-Japanese dictionary, Japanese-English dictionary, and the like), the compression rate can be improved.

Furthermore, the compressed memory capacity of the dictionary text can be significantly reduced to lower the cost of the product.

Furthermore, in the case where an apparatus (such as an electronic dictionary) that requires fixed dictionary text data of a large amount and that handles dictionary text in which a character string, though low in frequency of occurrence as a whole, but intensively occurring locally such as in an English-Japanese dictionary and the like, the capacity of the compression memory can be reduced significantly to lower the cost of the product without hardly degrading the retrieval performance of the dictionary text.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A text compression dictionary generation apparatus, comprising:

a calculation unit for calculating, with respect to a target compression rate, a frequency guideline for each character string having a length of at least two characters, required to occur in the text to meet said target compression rate, a cutout unit for cutting out a character string from the text having a length of at least two characters which occurs at a frequency matching the corresponding frequency guideline of a character string, together with the actual frequency in a descending order of length of the character string to generate a first static dictionary, while simultaneously generating a group of remaining text not cut out and not matching said frequency guideline, an extraction unit for counting a frequency of each character of one character string length from the group of remaining text to generate a second static dictionary, and a dictionary build up unit for adding the second static dictionary to the first static dictionary to generate an eventual static dictionary.

2. The text compression dictionary generation apparatus according to claim 1, further comprising a character string cutout unit for decomposing an original character string in said eventual static dictionary into a plurality of other character strings including the longest character string, for deleting the decomposed original character string, and for increasing the actual frequency of the plurality of other character strings by the frequency of the deleted original character string.

3. The text compression dictionary generation apparatus according to claim 1, further comprising a character string cutout unit for decomposing an original character string in said eventual static dictionary into a plurality of other character strings that contribute greatest to increasing the compression rate, and for increasing the actual frequency of the plurality of other character strings by the frequency of the deleted original character string.

4. A text compression dictionary generation apparatus, comprising:

a calculation unit for calculating, with respect to a target compression rate, a frequency guideline for each character string having a length of at least two characters, required to occur in the text to meet said target compression rate, a sequential character string cutout unit for cutting out a character string from the text having a length of at least two characters which occurs at a frequency matching the corresponding frequency guideline of a character string length, together with the actual frequency in a descending order of the product of the character string length and actual frequency to generate a first static dictionary, while simultaneously generating a group of remaining text not cut out and not matching said frequency guideline, and for finding a symbol having an efficiency indicating function value independent of the character string length, an extraction unit to count the frequency for each character of one character string length from the group of remaining text to generate a second static dictionary, and a dictionary build up unit for adding the second static dictionary to the first static dictionary to generate an eventual static dictionary.

5. The text compression dictionary generation apparatus according to claim 4, further comprising a character string cutout unit for decomposing an original character string in said eventual static dictionary into a plurality of other character strings including the longest character string, and deleting the original character string that is decomposed, and for increasing the actual frequency of the plurality of other character strings by the frequency of the deleted original character string.

6. The text compressing dictionary generation apparatus according to claim 4, further comprising a character string cutout unit for decomposing an original character string in said eventual static dictionary into a plurality of other character strings that contribute greatest to increasing the compression rate, and for increasing the actual frequency of the plurality of other character strings by the frequency of the deleted original character string.

7. A text compression dictionary generating apparatus, comprising:

a dictionary generation unit for dividing text into a plurality of unique structural elements, each structural element having a differing attribute, and for generating a compression dictionary including a plurality of symbols designating switching between each of said unique structural elements, wherein each one of said plurality of symbols correspond to a unique structural element, and wherein each one of said plurality of symbols are located at a boundary of their corresponding unique structural element to separate the element from another unique structural element; and a dictionary switch compression expansion unit for compressing and expanding the divided text while switching between each of the plurality of structural elements in the compression dictionary according to each encountered symbol, wherein the compression and expansion of divided text is performed separately in each of the plurality of structural elements to thereby enhance overall compression efficiency.

8. The text compression apparatus according to claim 7, wherein said text includes dictionary text having a translation and explanation in a second language corresponding to a word and phrase of a first language.

9. The text compression apparatus according to claim 8, wherein said dictionary text includes text of an English-Japanese dictionary.

10. A text compression dictionary generating apparatus, comprising:

a common dictionary generation unit for assembling a plurality of distinct texts sharing at least one common structural element, and for generating a common dictionary including a symbol designating switching between each of said plurality of distinct texts, wherein the symbol corresponds to a structural element common to at least two of said plurality of distinct texts, said symbol located at a boundary separating two distinct texts; and a dictionary switch compression expansion unit for compressing and expanding the plurality of distinct texts while switching between each grouping of at least two of the plurality of distinct texts according to each encountered symbol to thereby enhance overall compression efficiency.

11. The text compression apparatus according to claim 10, wherein said plurality of distinct texts further includes:

a dictionary having a translation and explanation in a second language applied to a word and phrase in a first language, and a dictionary having an explanation in the first language applied to a word and phrase in the first language.

12. The text compression apparatus according to claim 11, wherein said dictionary having a translation and explanation in the second language further includes:

an English-Japanese dictionary, a Japanese-English dictionary, and an English idiom dictionary, wherein said dictionary having an explanation in the first language includes a general dictionary.

13. A text compression dictionary generation apparatus comprising:

an offset substitution compression unit for substituting, an introduction symbol representing a first position occurrence of the local high frequency word and a character string length from said first position occurrence and subsequent occurrences to encode text in place of a local high frequency word in text, and an offset substitution expansion unit for expanding data compressed by the offset substitution compression unit by re-substituting the word specified by said first occurrence position and character string length in a location immediately after said introduction symbol to restore the compressed data to original text, thereby preventing degradation of retrieval performance of the text compression dictionary apparatus, since original text does not have to be expanded from the beginning of data compression.

14. The text compression apparatus according to claim 13, wherein said text includes dictionary text having a translation and explanation in a second language applied to a word and phrase in a first language.

15. The text compression apparatus according to claim 13, wherein said text includes dictionary text having an explanation in a first language applied to a word and phrase in the first language.

16. A text compression apparatus comprising:

a number substitution compression unit for assigning a number for a word of local high frequency in text at a first occurrence, and substituting the word with an introduction symbol which is a character string not present in said text, wherein the introduction symbol is with said assigned number at subsequent occurrences for coding, and a number substitution expansion unit for expanding data compressed by the number substitution compression unit by re-substituting the corresponding word for the introduction symbol and number to restore the compressed data to original text.

17. The text compression apparatus according to claim 16, wherein said text includes dictionary text having a translation and explanation in a second language applied to a word and phrase in a first language.

18. The text compression apparatus according to claim 16, wherein said text includes dictionary text having an explanation in a first language applied to a word and phrase in the first language.

19. A text compression dictionary generation method for use in a recording medium, comprising the steps of:

calculating, with respect to a target compression rate, a frequency guideline for each character string having a length of at least two characters, required to occur in the text to meet said target compression rate, cutting out a character string from the text having a length of at least two characters which occurs at a frequency matching the corresponding frequency guideline of a character string length, together with the actual frequency in a descending order of the character string length to generate a first static dictionary, while simultaneously generating a group of remaining text not cut out and not matching said frequency guideline, counting a frequency of each character of one character string length from said group of remaining text not cut out to generate a second static dictionary, and adding said second static dictionary to said first static dictionary to generate an eventual static dictionary.

20. The method according to claim 19, further comprising:

decomposing an original character string in said eventual static dictionary into a plurality of other character strings including the longest character string, deleting the decomposed original character string, and increasing the actual frequency of the plurality of other character strings by the frequency of the deleted original character string.

21. A text compression dictionary method, comprising:

dividing text into a plurality of unique structural elements, each structural element having a differing attribute;

generating a compression dictionary including a plurality of symbols designating switching between each of said unique structural elements, wherein each one of said plurality of symbols correspond to a unique structural element, and wherein each of said symbols are located at a boundary of their corresponding unique structural element to separate the element from another unique structural element; and compressing and subsequently expanding the divided text while switching between the plurality of structural elements in the compression dictionary according to each encountered symbol.

22. A text compression dictionary generation method, comprising:

calculating a frequency guideline required to meet a target compression rate for a character string having a length of at least two characters;

deleting, where the frequency of the character string matches the calculated frequency guideline, a character string and its frequency in descending order of character string length from text having a length of at least two characters, so as to generate a first dictionary;

generating, simultaneously with said step of deleting, a grouping of remaining text which was not deleted or which did not match said frequency guideline;

counting a frequency of characters in said grouping which have a one-character string length to generate a second dictionary; and merging the two dictionaries together to form a composite text compression dictionary.

23. The method of claim 22, further comprising the step of decomposing a character string in said composite dictionary into a plurality of character strings, wherein the frequency of the plurality of strings is increased by the frequency of the decomposed string.

24. The method of claim 22, wherein said steps of calculating, deleting, generating, counting and merging are controlled by a processor.

25. The method of claim 22, wherein said steps of calculating, deleting, generating, counting and merging are supplied by CD-ROM.

26. A text compression dictionary generation method, comprising:

substituting, in place of a high frequency word in text, a symbol representing both a first occurrence position of the high frequency word and its associated character string length, as well as subsequent occurrence positions, wherein said substituting is performed to encode an original text;

compressing the encoded text into compressed data; and expanding the compressed data by re-substituting the high frequency word at said first occurrence position in a location immediately after said symbol to restore the compressed data to original text, thereby preventing degradation of retrieval performance since the original text does not have to be expanded from the beginning of text compression.

27. A text compression dictionary generation method, comprising:

assigning a number for a high frequency word in an original text at a first occurrence;

substituting, in place of said word, a symbol which is a character string not present in said original text, wherein said substituting is performed to encode an original text;

compressing the encoded text into compressed data; and expanding the compressed data by re-substituting the high frequency word for said symbol to restore the compressed data to original text to thereby prevent any degradation of retrieval performance since the original text does not have to be expanded from the beginning of text compression.

* * * * *

UNITED STATES PATENT AND TRADEMARK OFFICE
CERTIFICATE OF CORRECTION

PATENT NO. : 6,047,298
DATED : April 4, 2000
INVENTOR(S) : Taro MORISHITA

It is certified that error appears in the above-identified patent and that said Letters Patent is hereby corrected as shown below:

Title page item [56], References cited, add:

-- 5,663,721     9/2/97     Rossi --

Signed and Sealed this

Fifth Day of September, 2000

Attest:

Q. TODD DICKINSON

*Attesting Officer*      *Director of Patents and Trademarks*